(12) United States Patent
Uno

(10) Patent No.: US 11,722,097 B2
(45) Date of Patent: Aug. 8, 2023

(54) INTEGRATED CIRCUIT DEVICE AND OSCILLATOR

(71) Applicant: SEIKO EPSON CORPORATION, Tokyo (JP)

(72) Inventor: Tomohiro Uno, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/690,436

(22) Filed: Mar. 9, 2022

(65) Prior Publication Data

US 2022/0294391 A1 Sep. 15, 2022

(30) Foreign Application Priority Data

Mar. 11, 2021 (JP) ................. 2021-038949

(51) Int. Cl.
*H03B 5/04* (2006.01)
*H03B 5/36* (2006.01)

(52) U.S. Cl.
CPC ............... *H03B 5/04* (2013.01); *H03B 5/364* (2013.01)

(58) Field of Classification Search
CPC ........................................................ H03B 5/04
USPC ......................................................... 331/116 R
See application file for complete search history.

(56) References Cited

U.S. PATENT DOCUMENTS

| 8,076,983 B2 * | 12/2011 | Ito ................. H05K 1/0201 |
| | | 331/116 R |
| 2015/0180443 A1 | 6/2015 | Hayashi et al. |
| 2015/0180444 A1 | 6/2015 | Hayashi et al. |
| 2016/0285461 A1 * | 9/2016 | Okubo ................. H03L 1/00 |
| 2020/0274487 A1 * | 8/2020 | Matsukawa .............. H03H 9/19 |

FOREIGN PATENT DOCUMENTS

| JP | 2015-122219 | 7/2015 |
| JP | 2015-122426 | 7/2015 |

* cited by examiner

*Primary Examiner* — Joseph Chang
(74) *Attorney, Agent, or Firm* — Rankin, Hill & Clark LLP

(57) ABSTRACT

An integrated circuit device includes a heat generating circuit controlled based on a temperature control signal. The heat generating circuit includes a heat generating transistor including a plurality of transistors that have a gate voltage controlled based on the temperature control signal and are coupled in parallel. A resistance value of a source resistance of the heat generating transistor is smaller than a resistance value of a drain resistance of the heat generating transistor.

14 Claims, 15 Drawing Sheets

FIG. 11

| GATE VOLTAGE [Ω] | SOURCE RESISTANCE [Ω] | ON-RESISTANCE [Ω] | DRAIN RESISTANCE [Ω] | CURRENT LIMITING RESISTOR [Ω] |
|---|---|---|---|---|
| 2.0 | 0.65 | 3.51 | 0.65 | 1 |
| 2.4 | 0.65 | 1.74 | 0.65 | 1 |
| 2.8 | 0.65 | 1.00 | 0.65 | 1 |

FIG. 12

| GATE VOLTAGE [Ω] | SOURCE RESISTANCE [Ω] | ON-RESISTANCE [Ω] | DRAIN RESISTANCE [Ω] | CURRENT LIMITING RESISTOR [Ω] |
|---|---|---|---|---|
| 2.0 | 0.44 | 2.51 | 1.18 | 1 |
| 2.4 | 0.44 | 1.16 | 1.18 | 1 |
| 2.8 | 0.44 | 0.80 | 1.18 | 1 |

INTEGRATED CIRCUIT DEVICE AND OSCILLATOR

The present application is based on, and claims priority from JP Application Serial Number 2021-038949, filed Mar. 11, 2021, the disclosure of which is hereby incorporated by reference herein in its entirety.

BACKGROUND

1. Technical Field

The present disclosure relates to an integrated circuit device and an oscillator.

2. Related Art

In the related Art, an integrated circuit device including a heat generating circuit is known. For example, JP-A-2015-122219 (PTL 1) discloses a heating element capable of reducing chances of decoupling caused by electromigration by a layout arrangement in which a current from a pad to a diffusion layer flows in a shortest path through a via hole. PTL 1 discloses a layout of an integrated circuit device having a configuration in which a plurality of transistors for heat generation control are coupled in parallel.

Transistors for heat generation control have a parasitic resistance in a source region and a drain region. It was found that when to reduce a size of an integrated circuit device including a heat generating circuit, heat generation performance of the heat generating circuit deteriorates due to the parasitic resistance in the source region.

SUMMARY

One aspect of the present disclosure relates to an integrated circuit device including a heat generating circuit controlled based on a temperature control signal. The heat generating circuit includes a heat generating transistor including a plurality of transistors that have a gate voltage controlled based on the temperature control signal and are coupled in parallel. A resistance value of a source resistance of the heat generating transistor is smaller than a resistance value of a drain resistance of the heat generating transistor.

Another aspect of the present disclosure relates to an oscillator including the above-mentioned integrated circuit device and a resonator whose temperature is controlled by the integrated circuit device.

BRIEF DESCRIPTION OF THE DRAWINGS

FIG. 11 is a diagram showing an example of resistance values of a source resistance, an on-resistance, and a drain resistance when the method according to the present embodiment is not applied.

FIG. 12 is a diagram showing an example of resistance values of a source resistance, an on-resistance, and a drain resistance when the method according to the present embodiment is applied.

DESCRIPTION OF EXEMPLARY EMBODIMENTS

Hereinafter, an embodiment will be described. The present embodiment described below does not unduly limit the content of the claims. Moreover, not all of the configurations described in the present embodiment are essential constituent elements.

1. Integrated Circuit Device

Figure 1:
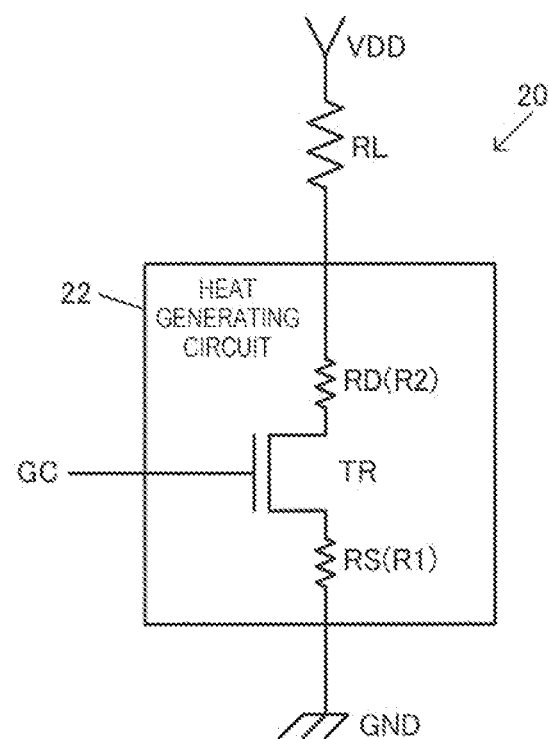
FIG. 1 shows a configuration example of an integrated circuit device according to an embodiment.

FIG. 1 shows a configuration example of an integrated circuit device 20 according to the present embodiment. The integrated circuit device 20 according to the present embodiment includes a heat generating circuit 22 controlled based on a temperature control signal GC. The heat generating circuit 22 includes a heat generating transistor TR having a gate voltage controlled based on the temperature control signal GC. The heat generating transistor TR is, for example, a metal oxide semiconductor (MOS) transistor, and specifically is, for example, an n-type MOS transistor. The heat generating transistor TR includes a plurality of transistors with reference to FIGS. 3 to 8 described later. The plurality of transistors are provided in parallel between a drain and a source of the heat generating transistor TR, and the temperature control signal GC is input to gates of the plurality of transistors. The temperature control signal GC is received from, for example, the outside of the integrated circuit device 20. The temperature control signal GC may be generated inside the integrated circuit device 20.

In FIG. 1, the integrated circuit device 20 includes a current limiting resistor RL. The current limiting resistor RL is provided between a VDD node, which is a power supply on a high potential side, and the drain of the heat generating transistor TR. The source of the heat generating transistor TR is coupled to a ground node that is a power supply on a low potential side. In the present embodiment, the ground is appropriately described as GND. The GND can also be called VSS. The current limiting resistor RL is constituted by, for example, a diffusion layer. The current limiting resistor RL is constituted by, for example, a diffusion layer that is the same as a diffusion layer constituting the drain of the heat generating transistor TR. A modification in which the current limiting resistor RL is constituted by a polysilicon layer or the like can also be implemented. The current limiting resistor RL is used as a resistor that limits an overcurrent from the VDD node from flowing to the heat generating transistor TR at startup due to power-on of VDD. For example, when a drain voltage of the heat generating transistor TR is VDR and a resistance value of the current limiting resistor RL is R, a current flowing through the heat generating transistor TR is limited to IL=(VDD−VDR)/R by the current limiting resistor RL at the startup. As an example, when the VDD is 3.0 V, the drain voltage VDR is 0.5 V, and a resistance value of the current limiting resistor RL is 2.5Ω), the current flowing through the heat generating transistor TR is limited to, for example, about 1 A. Until steady heat generation control of the heat generating transistor TR is performed based on the temperature control signal GC after the startup due to power-on, Joule heat generated by the current flowing through the current limiting resistor RL becomes the heat that controls the integrated circuit device 20. The integrated circuit device 20 is a heater IC. Meanwhile, when the steady heat generation control of the heat generating transistor TR is performed based on the temperature control signal GC, a current flowing from the VDD to the ground via the current limiting resistor RL and the heat generating transistor TR is controlled to a current of, for example, about 0.1 A to 0.3 A. Accordingly, the Joule heat generated by an on current flowing through the heat generating transistor TR becomes the heat that controls the integrated circuit device 20 that is a heater IC.

Figure 2:
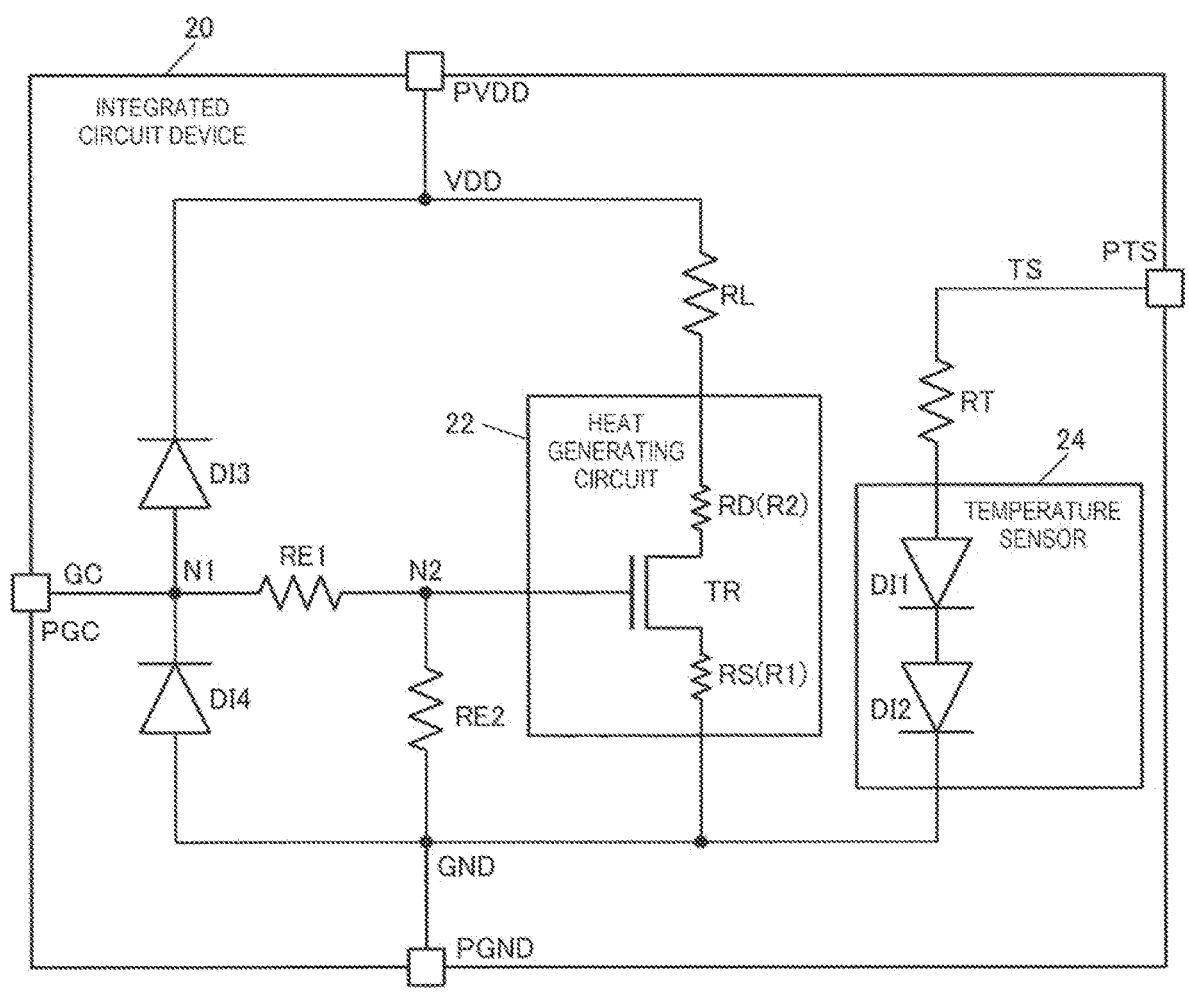
FIG. 2 shows a detailed configuration example of the integrated circuit device according to the present embodiment.

FIG. 2 shows a detailed configuration example of the integrated circuit device 20. In FIG. 2, the integrated circuit device 20 includes a temperature sensor 24 in addition to the heat generating circuit 22. The integrated circuit device 20 may also include diodes DI3 and DI4, resistors RE1, RE2, and RT, a power supply pad PVDD, a ground pad PGND, and pads PGC and PTS. The integrated circuit device 20 according to the present embodiment is not limited to the configuration in FIG. 2, and it is possible to carry out various modifications obtained by, for example, omitting a part of elements in FIG. 2, adding other elements, and changing the elements to other types of elements.

The pad PGC is a pad to which the temperature control signal GC is input. The pad PTS is a pad that outputs a temperature detection signal TS from the temperature sensor 24. The power supply pad PVDD is a pad supplied with the VDD that is a power supply voltage, and the ground pad PGND is a pad supplied with the ground GND.

The temperature sensor 24 is a sensor that detects a temperature. Specifically, the temperature sensor 24 outputs a temperature-dependent voltage that varies depending on an environment temperature as the temperature detection signal TS. For example, the temperature sensor 24 generates the temperature detection signal TS, which is a temperature detection voltage, using a temperature-dependent circuit element. Specifically, the temperature sensor 24 outputs the temperature detection signal TS whose voltage varies depending on the temperature by using temperature dependence of forward voltage a PN junction. For example, in FIG. 2, the temperature sensor 24 includes diodes DI' and DI2 that are provided in series between a node of the pad PTS, which is an output pad of the temperature detection signal TS, and a GND node, and have a forward direction from the node of the pad PTS to the GND node. The temperature sensor 24 outputs the temperature detection signal TS that is a temperature detection voltage based on a forward voltage of a PN junction of the diodes DI1 and DI2. A resistor RT is provided between the node of the pad PTS and the diode DI1 of the temperature sensor 24.

The diodes DI3 and DI4 and the resistor RE1 are circuits for electrostatic protection. The diode DI3 is a diode that is provided between an input node N1 of the temperature control signal GC input from the pad PGC and the VDD node, and has a forward direction from the input node N1 to the VDD node. The diode DI4 is a diode that is provided between the input node N1 of the temperature control signal GC and the GND node, and has a forward direction from the GND node to the input node N1. The resistor RE1 is provided between the input node N1 of the temperature control signal GC and a gate node N2 of the heat generating transistor TR to protect a gate of the heat generating transistor TR.

The resistor RE2 is a pull-down resistor that sets the gate of the heat generating transistor TR as the GND when the heat generation control of the heat generating transistor TR is not performed. The resistor RE2 is provided between the gate node N2 of the heat generating transistor TR and the GND node.

Figure 15:
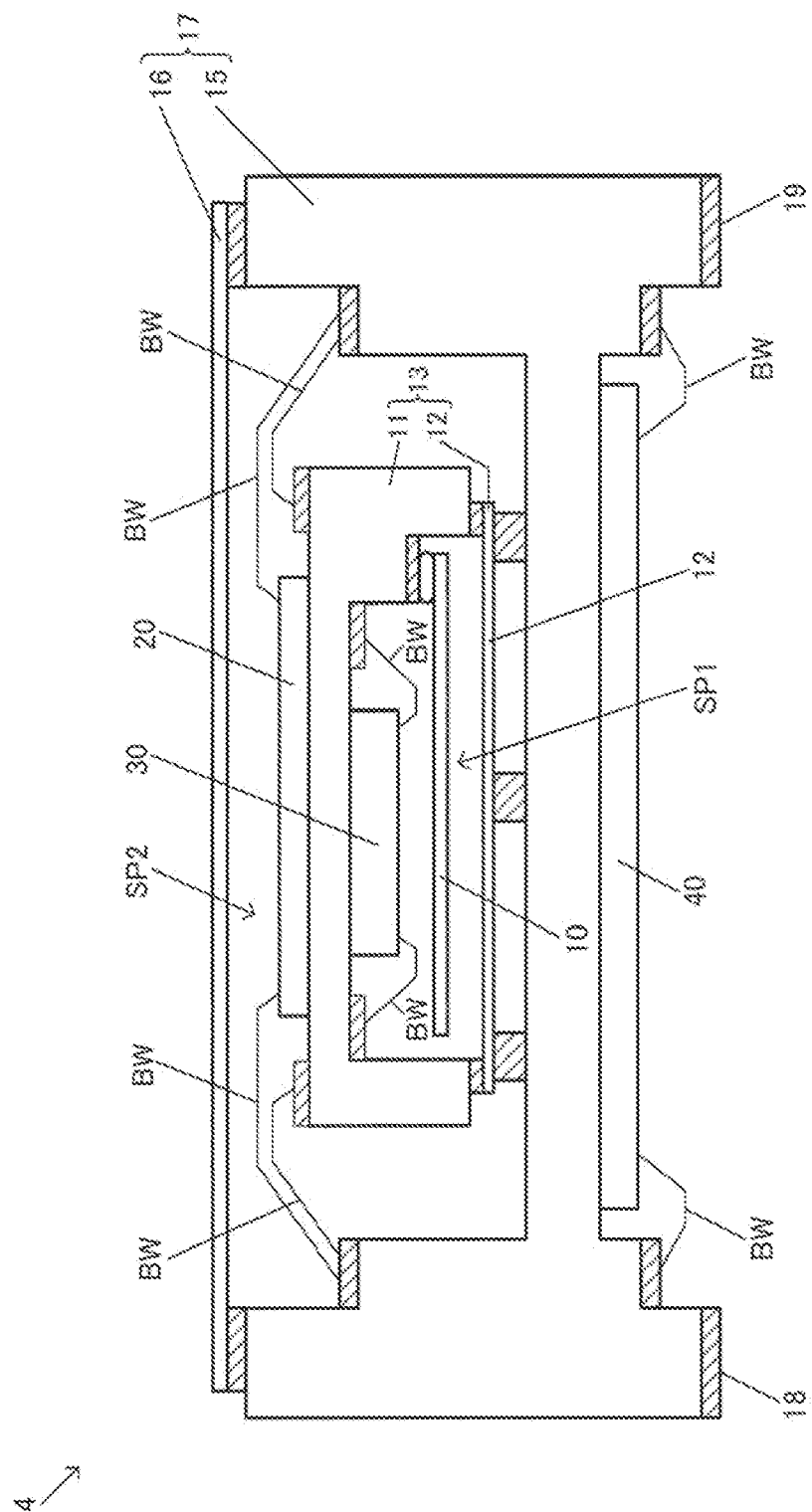
FIG. 15 shows a structure example of an oscillator.

There is a demand for size reduction of the integrated circuit device 20. For example, when the integrated circuit device 20 that is a heater IC is built in an oscillator 4 as shown in FIG. 15 described later, it is necessary to reduce a layout area of the integrated circuit device 20 to reduce its size when a size of the oscillator 4 is reduced. Meanwhile, since a heat generation capacity of the heater IC is determined by a size of the heat generating transistor TR, it is necessary to maintain the size of the heat generating transistor TR to implement the heater IC having the same heat generation capacity. Therefore, it is necessary to maintain W/L, which is the size of the heat generating transistor TR, and reduce the layout area of the integrated circuit device 20 to reduce its size.

As shown in FIGS. 1 and 2, a source resistance RS and a drain resistance RD, which are parasitic resistances, are provided in a source region and a drain region of the heat generating transistor TR. It was found that when the size of the integrated circuit device 20 is reduced, heat generation performance of the heat generating transistor TR deteriorates due to the parasitic resistances. For example, the above-mentioned PTL 1 discloses a stepped shape arrangement and a linear arrangement as layout arrangements of a heat generating transistor TR. In either of the arrangements, widths of a source region and a drain region that are diffusion regions are equal and a source resistance RS and a drain resistance RD are equal to each other. With an IC size in the related art, the source resistance RS and the drain resistance RD are not serious issues. However, it was found that the source resistance RS and the drain resistance RD increase as a size of a heater IC is reduced, and in particular, a gate-source voltage VGS of the heat generating transistor TR decreases due to an increase in the source resistance RS, and a current flowing through the heat generating transistor TR is limited. When the current is limited, a heat generation amount of the heat generating transistor TR decreases, and the heat generation performance deteriorates.

In this regard, as shown in FIGS. 1 and 2, the integrated circuit device 20 according to the present embodiment includes the heat generating circuit 22 controlled based on the temperature control signal GC. The heat generating circuit 22 includes the heat generating transistor TR including a plurality of transistors that have a gate voltage controlled based on the temperature control signal GC and are coupled in parallel. In the present embodiment, a resistance value R1 of the source resistance RS of the heat generating transistor TR is smaller than a resistance value R2 of the drain resistance RD of the heat generating transistor TR. The source resistance RS is, for example, a resistance due to the parasitic resistance in the source region of the heat generating transistor TR. The source resistance RS is, for example, a resistance in the source region of the heat generating transistor TR, and is, for example, a resistance in a current path from a channel end of the source region of the heat generating transistor TR to the GND node. The drain resistance RD is, for example, a resistance due to the parasitic resistance in the drain region of the heat generating transistor TR. The drain resistance RD is, for example, a resistance in the drain region of the heat generating transistor TR, and is, for example, a resistance in a current path from a channel end of the drain region of the heat generating transistor TR to one end of the current limiting resistor RL. When the current limiting resistor RL is not provided, the drain resistance RD is a resistance in a current path from the channel end of the drain region of the heat generating transistor TR to the VDD node.

For example, in the related art of PTL 1, the width of the source region and the width of the drain region of the plurality of transistors constituting the heat generating transistor TR are equal to each other, and R1=R2 is satisfied for the resistance value R1 of the source resistance RS and the resistance value R2 of the drain resistance RD. In contrast, in the integrated circuit device 20 according to the present embodiment, R1<R2 is satisfied for the resistance value R1 of the source resistance RS and the resistance value R2 of the drain resistance RD of the heat generating transistor TR. For example, the plurality of transistors constituting the heat generating transistor TR are laid out such that R1<R2 is satisfied. Specifically, for example, R1<0.8×R2 is satisfied, and the resistance value R1 of the source resistance RS is less than 80% of the resistance value R2 of the drain resistance RD. More preferably, R1<0.6×R2 is satisfied, and the resistance value R1 of the source resistance RS is less than 60% of the resistance value R2 of the drain resistance RD.

For example, in FIGS. 1 and 2, the gate voltage of the heat generating transistor TR set by the temperature control signal GC is VG, the gate-source voltage of the heat generating transistor TR is VGS, and the current flowing through the heat generating transistor TR is Id. At this time, VGS=VG−R1×Id is satisfied. That is, when the resistance value R1 of the source resistance RS increases, the gate-source voltage VGS of the heat generating transistor TR decreases, the heat generation amount of the heat generating transistor TR decreases, and the heat generation performance decreases with respect to the same gate voltage VG.

In this regard, in the present embodiment, the resistance values R1 and R2 of the source resistance RS and the drain resistance RD satisfy R1<R2. Therefore, it is possible to prevent a decrease in the gate-source voltage VGS=VG−R1×Id of the heat generating transistor TR, and it is possible to prevent a decrease in the heat generation capacity due to the parasitic resistances of the heat generating transistor TR. Meanwhile, even if the resistance value R2 of the drain resistance RD relatively increases by decreasing the resistance value R1 of the source resistance RS, the increase in the resistance value R2 does not adversely affect the gate-source voltage VGS=VG−R1×Id of the heat generating transistor TR. That is, since the drain resistance RD has the same function as that of the current limiting resistor RL in FIGS. 1 and 2, with a layout arrangement in which the resistance value R1 of the source resistance RS is decreased to increase the resistance value R2 of the drain resistance RD, it is possible to effectively prevent a decrease in the heat generation capacity of the heat generating transistor TR due to the parasitic resistances.

2. Layout Arrangement of Heat Generating Transistor

Figure 3:
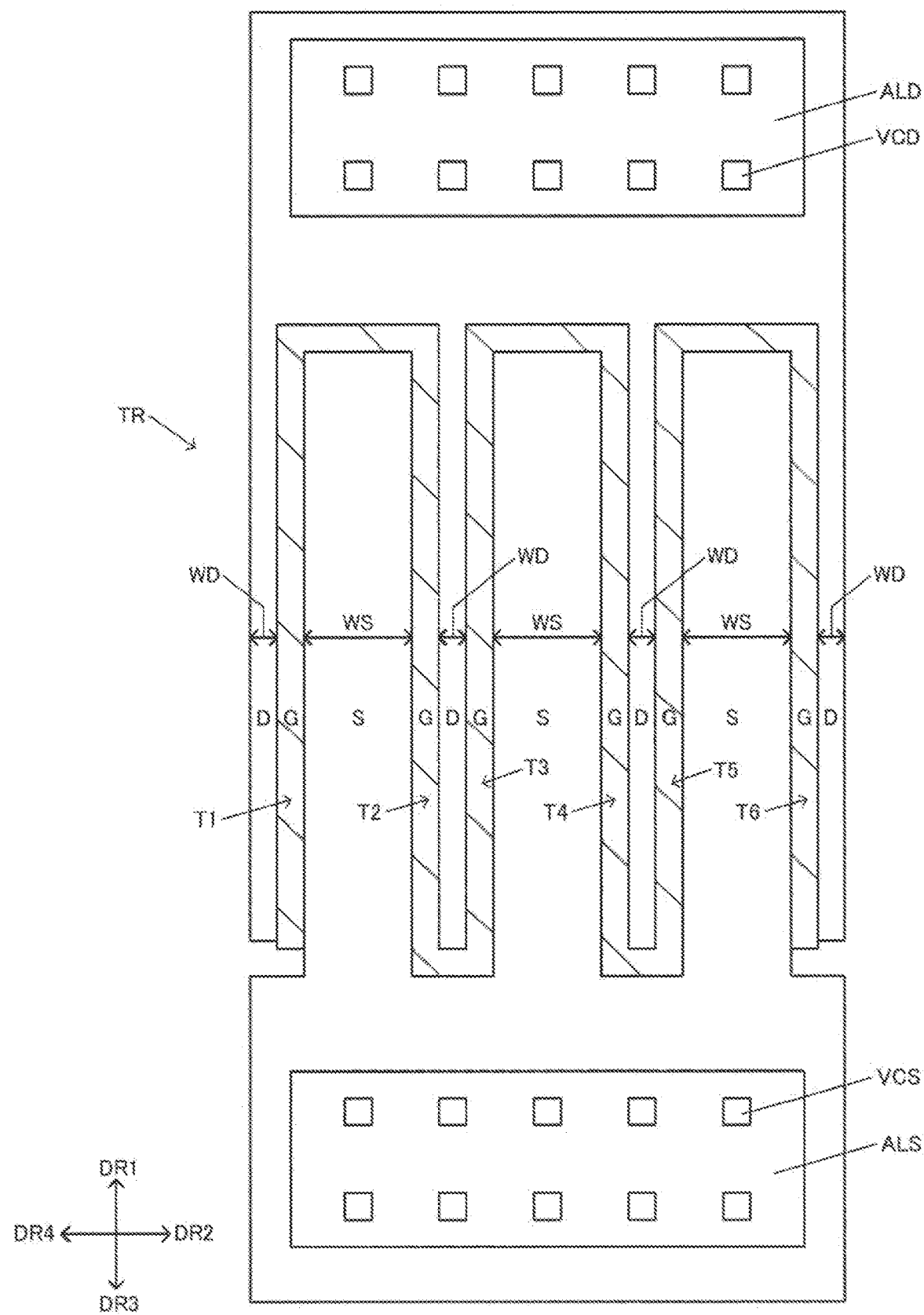
FIG. 3 shows a first arrangement example of a heat generating transistor.

Next, the layout arrangement of the heat generating transistor TR will be described. FIG. 3 shows a first arrangement example of the heat generating transistor TR. Here, a direction orthogonal to a direction DR1 is referred to as DR2. A direction opposite to the direction DR1 is referred to as DR3, and a direction opposite to the direction DR2 is referred to as DR4. The directions DR1, DR2, DR3, and DR4 are a first direction, a second direction, a third direction, and a fourth direction, respectively.

As shown in FIG. 3, the heat generating transistor TR includes a plurality of transistors T1, T2, T3, T4, T5, and T6. The transistors T1, T2, T3, T4, T5, and T6 are a first transistor, a second transistor, a third transistor, a fourth transistor, a fifth transistor, and a sixth transistor, respectively. The temperature control signal GC is input to gates of the plurality of transistors T1 to T6, and the plurality of transistors T1 to T6 are provided in parallel between the drain and the source of the heat generating transistor TR. FIG. 3 is a schematic diagram of the layout arrangement of the heat generating transistor TR. A length of the plurality of transistors T1 to T6 in the direction DR1 and the number of columns in the direction DR2 are different from actual layout arrangements in FIGS. and 14 described later. Similarly, the layout arrangements in FIGS. 5, 6 and 8 described later are also schematic diagrams.

In FIG. 3, in a plan view, the plurality of transistors T1 to T6 are arranged such that a longitudinal direction of the gates is along the direction DR1. The plan view is, for example, a plan view in a direction orthogonal to a semiconductor substrate of the integrated circuit device 20. The plurality of transistors T1 to T6 are arranged side by side along the direction DR2 orthogonal to the direction DR1. That is, the gates of the transistors T1 to T6 are along the direction DR1 in which the longitudinal direction of the gates is the first direction. When the second direction orthogonal to the direction DR1 is the direction DR2, the transistor T2 is arranged on the transistor T1 side in the direction DR2, the transistor T3 is arranged on the transistor T2 side in the direction DR2, and the transistor T4 is arranged on the transistor T3 side in the direction DR2. The same applies to the transistors T5 and T6. In this way, the transistors T1 to T6 are arranged side by side along the direction DR2.

In FIG. 3, a metal wiring ALS and via holes VCS coupling the metal wiring ALS and a diffusion region constituting the source region of the heat generating transistor TR are provided. The metal wiring ALS corresponds to a pad wiring of the ground pad PGND in FIGS. 13 and 14 described later, and the GND is supplied to the metal wiring ALS. Further, in FIG. 3, via holes VCD that electrically couple a metal wiring ALD and a diffusion region constituting the drain region of the heat generating transistor TR are provided. The metal wiring ALD corresponds to a pad wiring of the power supply pad PVDD in FIGS. 13 and 14 described later, and the VDD is supplied to the metal wiring ALD. The metal wiring ALS and ALD are implemented by a metal layer of the integrated circuit device 20 such as an aluminum layer.

Figure 4:
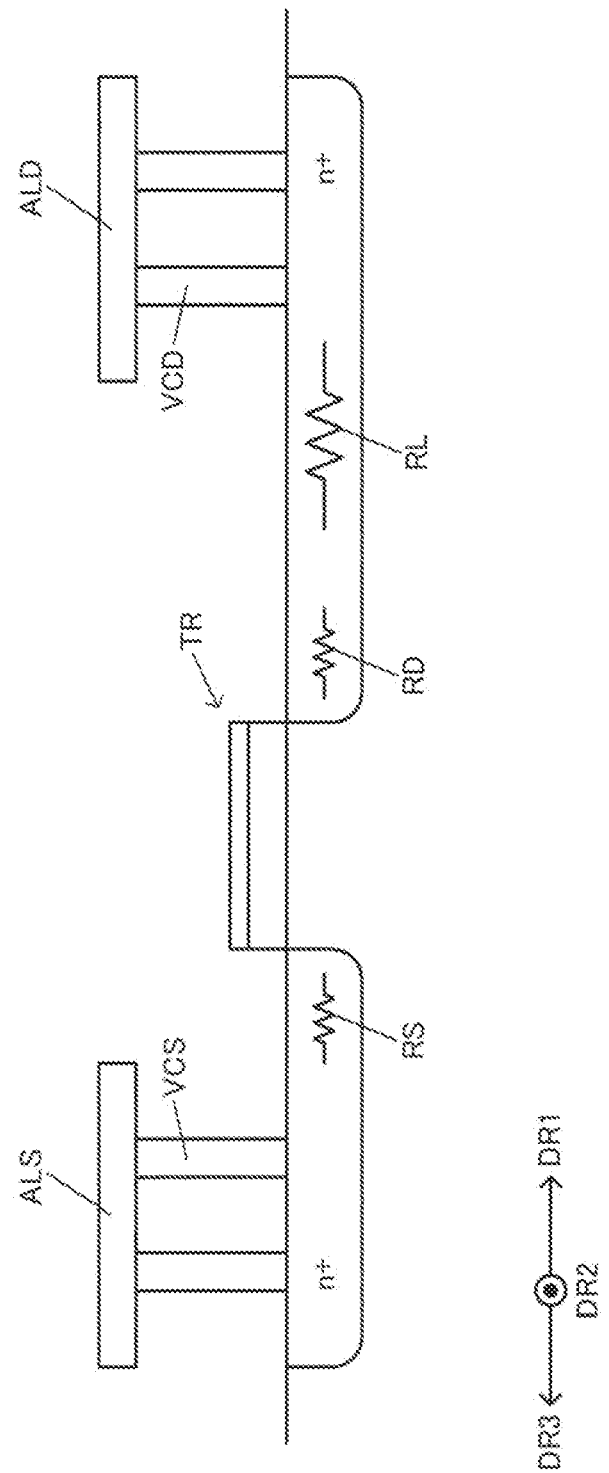
FIG. 4 is a schematic cross-sectional view of the heat generating transistor.
Figure 13:
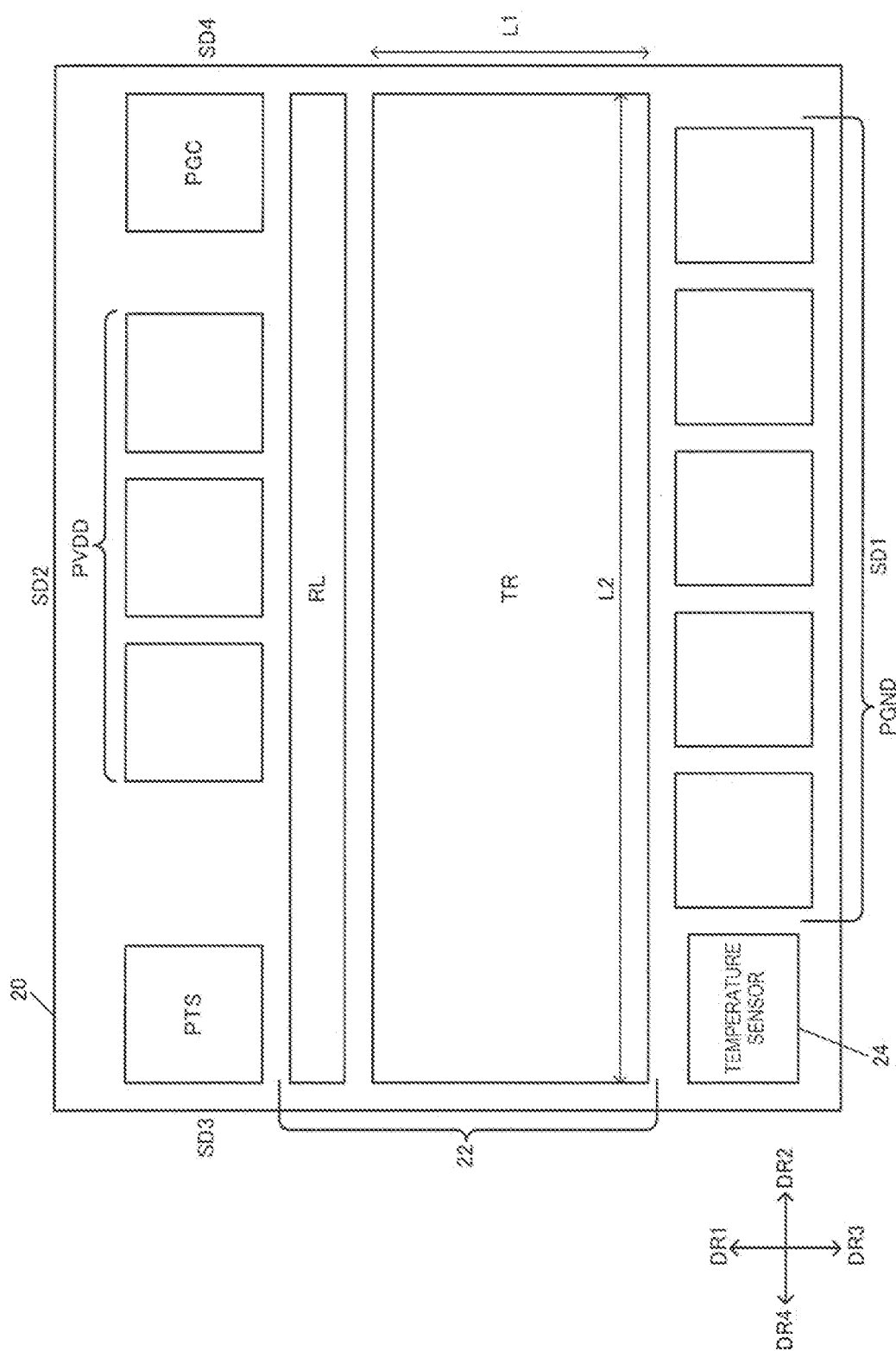
FIG. 13 shows an example of a layout arrangement of the integrated circuit device according to the present embodiment.
Figure 14:
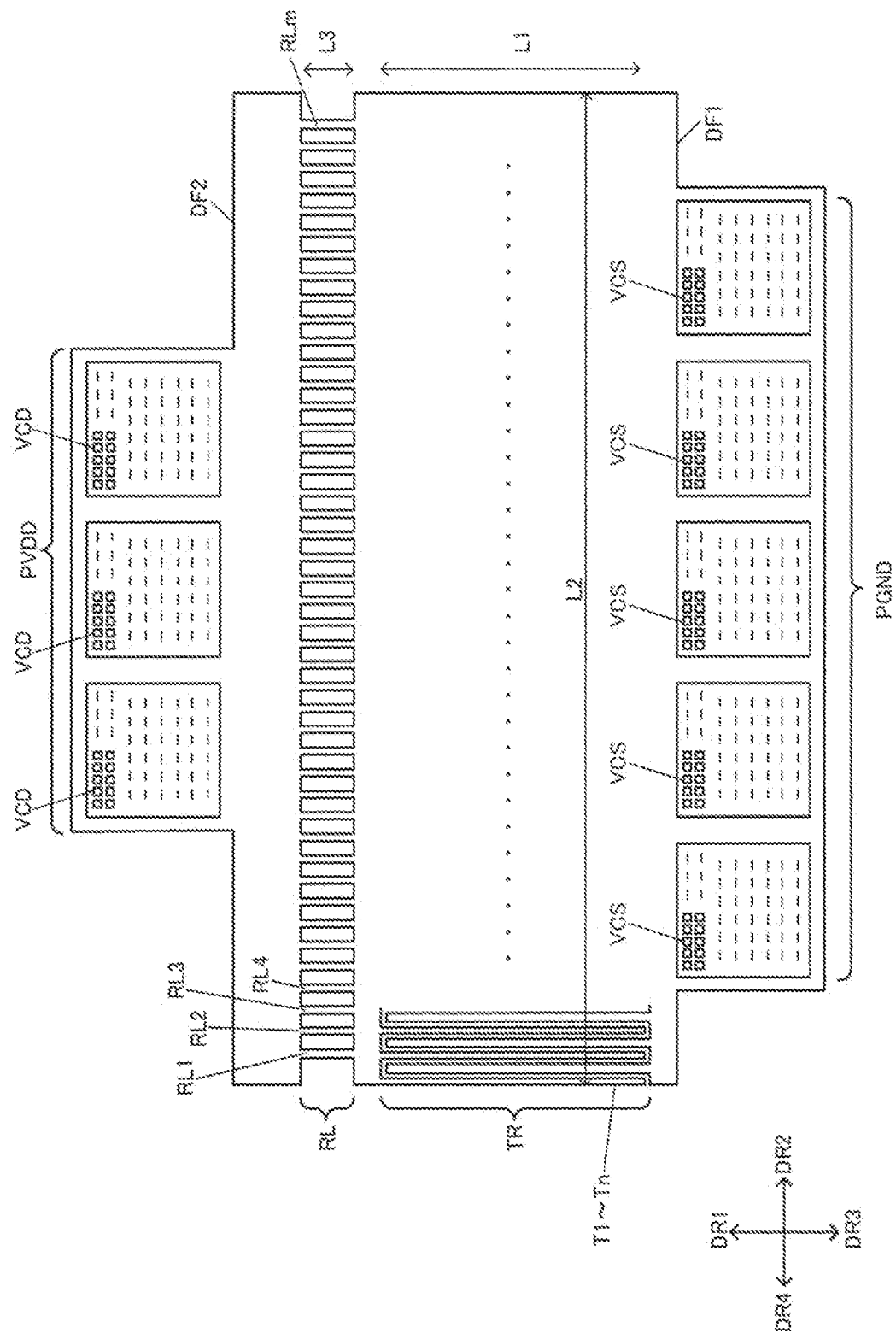
FIG. 14 shows an example of the layout arrangement of the integrated circuit device according to the present embodiment.

FIG. 4 shows a schematic cross-sectional view of the heat generating transistor TR. As shown in FIG. 4, the metal wiring ALS, which is a metal wiring pattern on the source side, is coupled to the n-type diffusion region, which is an n+ diffusion region constituting the source region of the heat generating transistor TR, through the via holes VCS. The metal wiring ALD, which is a metal wiring pattern on the drain side, is coupled to the n-type diffusion region, which is an n+ diffusion region constituting the drain region of the heat generating transistor TR, through the via holes VCD. FIG. 4 shows the current limiting resistor RL (not shown in FIG. 3). The current limiting resistor RL is implemented by a diffusion resistor in the diffusion region constituting the drain region of the heat generation transistor TR, and is provided between the heat generating transistor TR and the power supply pad PVDD as shown in FIGS. 13 and 14 described later.

As shown in FIG. 3, a width WS of a source region S of the transistor T1 in the direction DR2 in a plan view is larger than a width WD of a drain region D of the transistor T1 in the direction DR2. The source region S of the transistor T1, which is the first transistor, is a first source region, and the drain region D is a first drain region. That is, in FIG. 3, WS>WD is satisfied for the width WS of the source region S and the width WD of the drain region D of the transistor T1. Specifically, for example, WS>1.2×WD is satisfied, and the width WS of the source region S is larger than 1.2 times the width WD of the drain region D. More preferably, WS>1.4×WD is satisfied, and the width WS of the source region S is larger than 1.4 times the width WD of the drain region D.

As described above, when the width WS of the source region S and the width WD of the drain region D of the transistor T1 constituting the heat generating transistor TR satisfy WS>WD, the resistance value R1 of the source resistance RS can be made smaller than the resistance value R2 of the drain resistance RD. For example, in FIG. 3, the resistance value R1 of the source resistance RS corresponding to a resistance in a current path from the via holes VCS of the metal wiring ALS to which the GND is supplied to a channel end of the source region S of the transistor T1 can be made smaller than the resistance value R2 of the drain resistance RD. Therefore, it is possible to effectively prevent deterioration of the heat generation performance of the heat generating transistor TR due to a decrease in the gate-source voltage caused by the source resistance RS.

The plurality of transistors of the heat generating transistor TR include the transistor T2. As shown in FIG. 3, a width of a source region S of the transistor T2 in the direction DR2 in a plan view is larger than a width WD of a drain region D of the transistor T2 in the direction DR2. The source region S of the transistor T2, which is the second transistor, is a second source region, and the drain region D of the transistor T2 is a second drain region. That is, in FIG. 3, WS>WD is satisfied for the width WS of the source region S and the width WD of the drain region D of the transistor T2. Similarly to the transistor T1, for the transistor T2, WS>1.2×WD is satisfied, for example, and more preferably, WS>1.4×WD is satisfied.

As described above, when the width WS of the source region S and the widths WD of the drain regions D of the transistors T1 and T2 constituting the heat generating transistor TR satisfy WS>WD, the resistance value R1 of the source resistance RS can be made smaller than the resistance value R2 of the drain resistance RD. Therefore, it is possible to effectively prevent deterioration of the heat generation performance of the heat generating transistor TR due to a decrease in the gate-source voltage caused by the source resistance RS.

The source region S of the transistor T1 and the source region S of the transistor T2 refer to a source region shared between the transistor T1 and the transistor T2. That is, the source region S is shared between the transistors T1 and T2. As described above, the source region S is shared between the transistors T1 and T2, and it is possible to prevent an increase in a width of the heat generating transistor TR in the direction DR2 even when the width WS of the source region S of the transistors T1 and T2 is increased to WS>WD. That is, when the width WS of the source region S is increased and the source regions S of the transistors T1 and T2 are arranged side by side along the direction DR2 without being shared between the transistors T1 and T2, the width of the heat generating transistor TR in the direction DR2 may increase. By sharing the source region S, it is possible to prevent such a situation from occurring. Therefore, the width WS of the source region S can be increased to reduce the resistance value R1 of the source resistance RS, and to prevent an increase in the layout area of the heat generating transistor TR.

For the other transistors T3, T4, T5, and T6 constituting the heat generating transistor TR, WS>WD is satisfied for the width WS of the source region S and the width WD of the drain region D, which is similar to the transistors T1 and T2. This makes it possible to make the resistance value R1 of the source resistance RS of the heat generating transistor TR smaller than the resistance value R2 of the drain resistance RD. Further, the transistor T3 and the transistor T4 share a source region S, and the transistor T5 and the transistor T6 share a source region S. Accordingly, the width WS of the source region S can be increased to reduce the resistance value R1 of the source resistance RS, and to prevent an increase in the layout area of the heat generating transistor TR.

In FIG. 3, a polysilicon wire constituting a gate G of the transistor T1 is wired along the direction DR1, folded back at an end portion of the transistor T1 in the direction DR1, and wired along the direction DR3, whereby a gate G of the transistor T2 is obtained. The polysilicon wire is folded back at an end portion of the transistor T2 in the direction DR3 and wired along the direction DR1 to constitute a gate G of the transistor T3, and is folded back at an end portion of the transistor T3 in the direction DR1 and wired along the direction DR3 to constitute a gate G of the transistor T4. Gates G of the transistors T5 and T6 are formed in the same manner. Although not particularly limited, as an example, the width WS of the source region S is, for example, about 8 μm, the width WD of the drain region D is, for example, about 3 μm, and a channel length L corresponding to a width of the gate G is, for example, about 3 μm.

Figure 5:
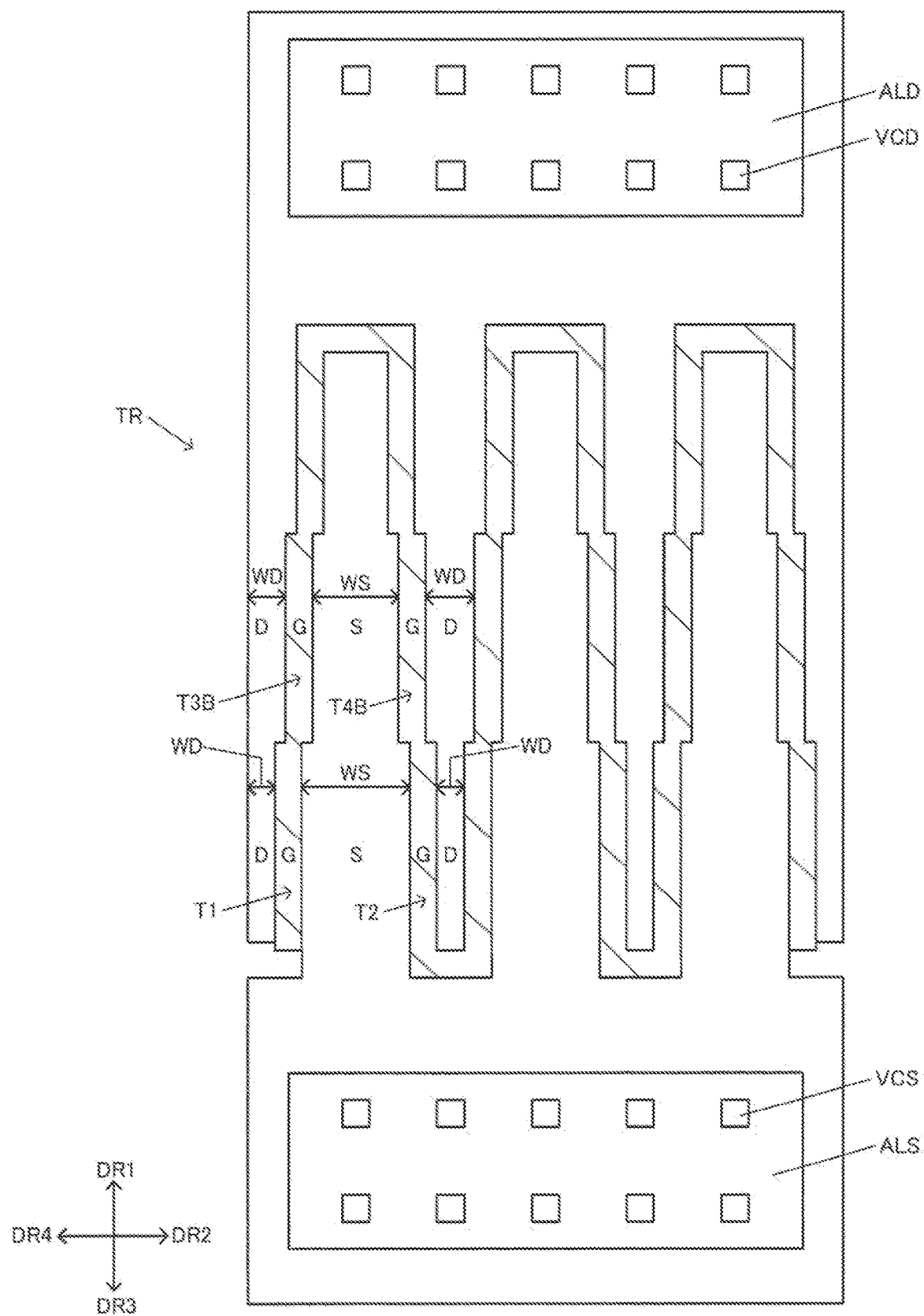
FIG. 5 shows a second arrangement example of the heat generating transistor.

FIG. 5 shows a second arrangement example of the heat generating transistor TR. FIG. 5 shows an example of a layout arrangement in which end portions of the source regions S and end portions of the drain regions D of the plurality of transistors of the heat generating transistor TR are formed in a stepped shape.

In FIG. 5, the plurality of transistors of the heat generating transistor TR include the transistors T1 and T2. The width WS of the source region S of the transistors T1 and T2 in the direction DR2 in a plan view is larger than the width WD of the drain region D of the transistors T1 and T2 in the direction DR2.

The plurality of transistors of the heat generating transistor TR include a transistor T3B provided in the direction DR1 of the transistor T1. The transistor T3B is the third transistor. In a plan view, a width WS of a source region S of the transistor T3B in the direction DR2 is larger than a width of a drain region D of the transistor T3B in the direction DR2. The source region S of the transistor T3B is a third source region, and the drain region D of the transistor T3B is a third drain region.

In FIG. 5, the gate G of the transistor T1 is deviated from a gate G of the transistor T3B in the direction DR2. The gate G of the transistor T1 is a first gate, and the gate G of the transistor T3B is a third gate. That is, at the end portion of the transistor T1 in the direction DR1, the gate G of the transistor T3B is arranged at a position deviated from the gate G of the transistor T1 toward the direction DR2 side. For example, a polysilicon wire constituting the gate G is folded and wired toward the direction DR2 side at the end portion of the transistor T1 in the direction DR1. At a boundary between the transistor T1 and the transistor T3B, for example, no channel is formed.

In this way, it is possible to implement the layout arrangement of the transistors T1 and T3B in which end portions of the transistors T1 and T3B on a channel side are not formed in a linear shape along the direction DR1 as shown in FIG. 3, but are formed in a stepped shape in the direction DR1. Also in this case, the widths WS of the source regions S of the transistors T1 and T3B are larger than the widths WD of the drain regions D, and thus the resistance value R1 of the source resistance RS of the heat generating transistor TR can be made smaller than the resistance value R2 of the drain resistance RD. Accordingly, it is possible to effectively prevent deterioration of the heat generation performance of the heat generating transistor TR due to a decrease in the gate-source voltage caused by the source resistance RS.

In FIG. 5, the plurality of transistors of the heat generating transistor TR include the transistor T3B and a transistor T4B in addition to the transistors T1 and T2. The transistor T3B is the third transistor and transistor T4B is the fourth transistor. The transistor T3B is provided in the direction DR1 of the transistor T1 and the transistor T4B is provided in the direction DR1 of the transistor T2. As shown in FIG. 5, the source region S of the transistor T1 and the source region S of the transistor T2 refer to a source region shared between the transistor T1 and the transistor T2. The source region S of the transistor T1 is the first source region, and the source region S of the transistor T2 is the second source region. Further, the source region S of the transistor T3B and a source region S of the transistor T4B refer to a source region shared between the transistor T3B and the transistor T4B. The source region S of the transistor T3B is the third source region, and the source region S of the transistor T4B is the fourth source region.

The gate G of the transistor T3B is deviated from the gate G of the transistor T1 in the direction DR2. The gate G of the transistor T4B is deviated from the gate G of the transistor T2 in the direction DR4 that is the direction opposite to the direction DR2. The gates of the transistors T1, T2, T3B, and T4B are the first gate, a second gate, the third gate, and a fourth gate, respectively.

In this way, it is possible to implement the layout arrangement of the transistors T1, T2, T3B, and T4B in which the end portions of the transistors T1 and T3B on the channel side are formed in a stepped shape in the direction DR1, and end portions of the transistors T2 and T4B on a channel side are formed in a stepped shape in the direction DR1. As shown in FIG. 5, the width WS of the source region S shared between the transistors T1 and T2 can be made larger than the width WS of the source region S shared between the transistors T3B and T4B. For example, a larger current flows in the source region S shared between the transistors T3B and T4B than in the source region S shared between the transistors T1 and T2. This is because the current flowing from the source region S shared between the transistors T3B and T4B to the drain region D also flows to the source region S shared between the transistors T1 and T2. Therefore, as shown in FIG. 5, by performing a layout arrangement such that the width WS of the shared source region S through which a large current flows is large, it is possible to set an appropriate width WS of the source region S according to a quantity of current.

Also in this case, the width of the source region S shared between the transistors T1 and T2 is larger than the widths of the drain regions D of the transistors T1 and T2, and the width of the source region S shared between the transistors T3B and T4B is larger than widths of drain regions D of the transistors T3B and T4B.

As described above, when the width of the source region S shared between the transistors T1 and T2 is larger than the widths of the drain regions D thereof, and the width of the source region S shared between the transistors T3 and T4 is also larger than the widths of the drain regions D thereof, the resistance value R1 of the source resistance RS of the heat generating transistor TR can be made smaller than the resistance value R2 of the drain resistance RD. Therefore, it is possible to effectively prevent deterioration of the heat generation performance of the heat generating transistor TR due to a decrease in the gate-source voltage caused by the source resistance RS.

Figure 6:
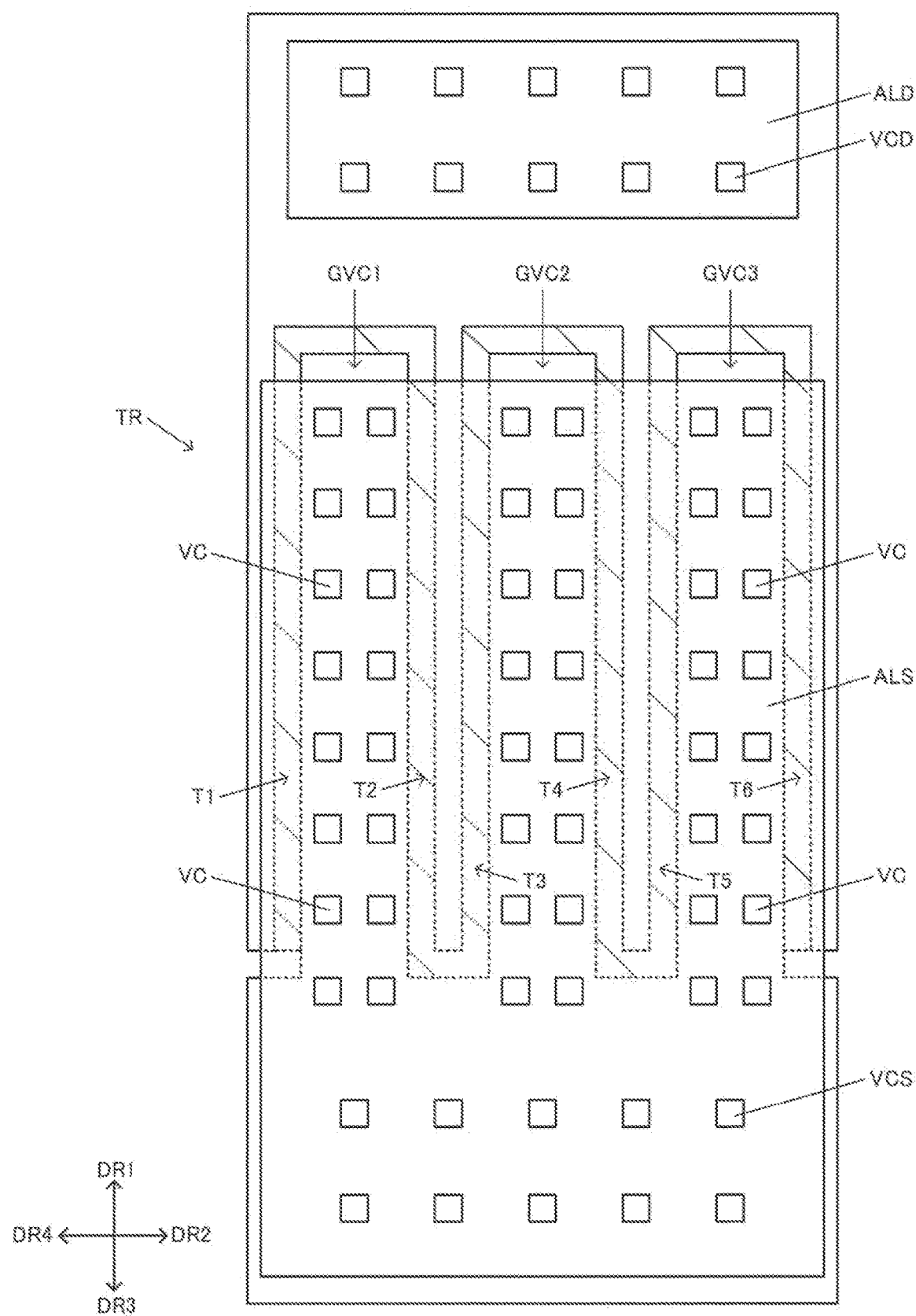
FIG. 6 shows a third arrangement example of the heat generating transistor.

FIG. 6 shows a third arrangement example of the heat generating transistor TR. The integrated circuit device 20 according to the present embodiment to which the third arrangement example in FIG. 6 is applied includes the heat generating circuit 22 controlled based on the temperature control signal GC. The heat generating circuit 22 includes the heat generating transistor TR including the plurality of transistors T1 to T6 that have a gate voltage controlled based on the temperature control signal GC and are coupled in parallel, the metal wiring ALS that overlaps the plurality of transistors T1 to T6 in a plan view, and a plurality of via holes VC each having one end coupled to the metal wiring ALS and the other end coupled to the plurality of source regions of the plurality of transistors T1 to T6. The metal wiring ALS supplies the ground to the source of the heat generating transistor TR. In FIG. 6, the metal wiring ALS overlaps the plurality of transistors T1 to T6 constituting the heat generating transistor TR in a plan view. For example, the metal wiring ALS having a solid pattern on its entire surface overlaps the plurality of transistors T1 to T6 of the heat generating transistor TR in a plan view. For example, the metal wiring ALS having a large width corresponding to a width of an arrangement region of the plurality of transistors T1 to T6 in the direction DR2 constituting the heat generating transistor TR overlaps the plurality of transistors T1 to T6 of the heat generating transistor TR in a plan view. A width of the metal wiring ALS in the direction DR2 covers the plurality of via holes VC coupled to the plurality of source regions of the plurality of transistors T1 to T6.

Figure 7:
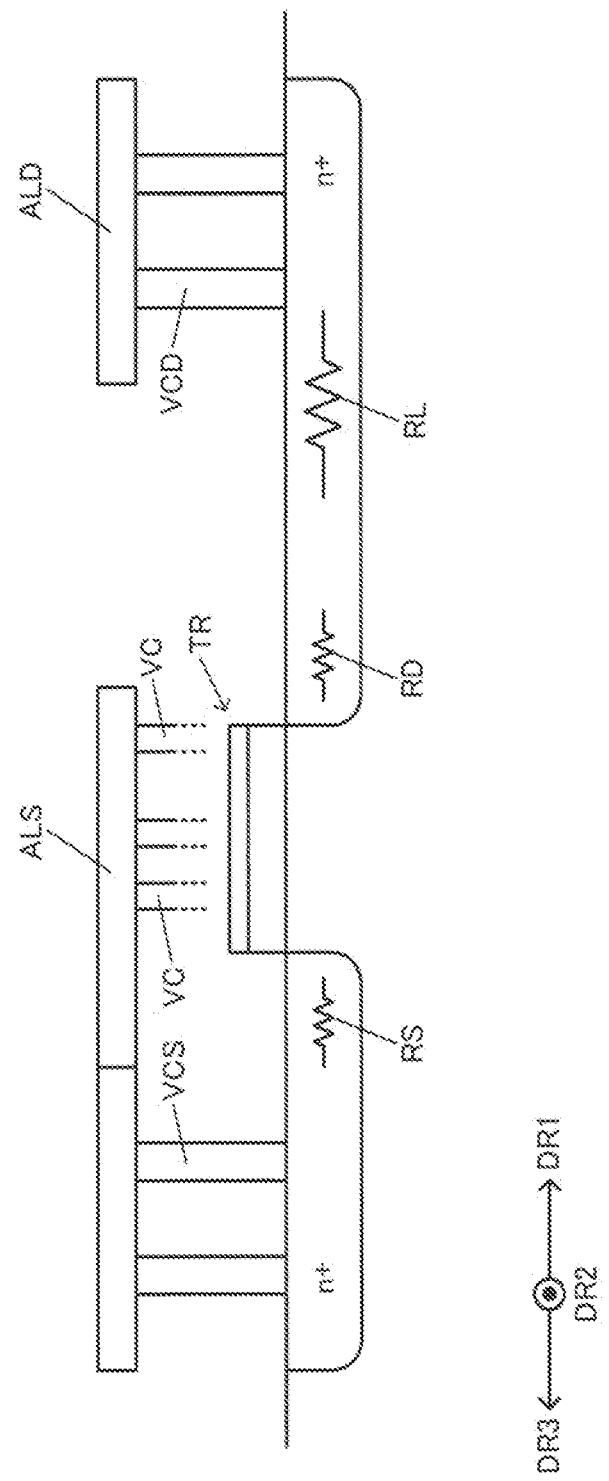
FIG. 7 is a schematic cross-sectional view of the heat generating transistor.

For example, FIG. 7 shows a schematic cross-sectional view of the heat generating transistor TR in FIG. 6. As shown in FIG. 7, the metal wiring ALS extends in the direction DR1 from positions of the via holes VCS coupled to the n-type diffusion region, and is wired to overlap the plurality of transistors T1 to T6 constituting the heat generating transistor TR from above. A part of the transistors T1 to T6 may have a portion that does not overlap the metal wiring ALS in a plan view.

In FIG. 6, the plurality of via holes VC are provided, each having one end coupled to the metal wiring ALS and the other end coupled to the source regions of the plurality of transistors T1 to T6. In FIG. 6, the plurality of via holes VC are provided at positions overlapping the plurality of source regions of the plurality of transistors T1 to T6 in a plan view. For example, the via hole VC that supplies the GND to the source region of the transistor T1 is provided at a position overlapping the source region of the transistor T1, and the via hole VC that supplies the GND to the source region of the transistor T2 is provided at a position overlapping the source region of the transistor T2. Similarly, the via holes VC that supply the GND to the source regions of the transistors T3, T4, T5, and T6 are provided at positions overlapping the source regions of the transistors T3, T4, T5, and T6, respectively.

In this way, the ground can be supplied from the metal wiring ALS overlapping the plurality of transistors T1 to T6 of the heat generating transistor TR in a plan view to the source regions of the plurality of transistors T1 to T6 via the plurality of via holes VC overlapping the source regions in a plan view. Therefore, currents from the source regions of the plurality of transistors T1 to T6 flow to the ground via the metal wiring ALS having a resistance value smaller than the diffusion regions constituting the source regions and the plurality of via holes VC. Therefore, it is possible to effectively reduce the resistance value R1 of the source resistance RS of the heat generating transistor TR. Accordingly, it is possible to effectively prevent deterioration of the heat generation performance of the heat generating transistor TR due to a decrease in the gate-source voltage caused by the source resistance RS.

Since the wiring pattern of the metal wiring ALS can be made into a large wiring pattern having a large width in the direction DR2, it is possible to prevent the metal wiring ALS and the via holes VC from being decoupled or short-circuited due to electromigration. That is, since a large current flows through the heat generating transistor TR, decoupling and short circuit may occur due to electromigration when the metal wiring ALS is thin. In this regard, in FIG. 8, the metal wiring ALS having a large width overlaps the entire surface of the source regions of the plurality of transistors T1 to T6 of the heat generating transistor TR. Therefore, it is possible to prevent decoupling and short circuit even when a large current flows through the heat generating transistor TR.

The plurality of transistors of the heat generating transistor TR include the transistor T1 and the transistor T2 having a source region shared with the transistor T1. The transistors T1 and T2 are the first transistor and the second transistor, respectively. As shown in FIG. 6, a first via hole group GVC1 of the plurality of via holes overlaps the source region shared between the transistor T1 and the transistor T2 in a plan view. For example, the first via hole group GVC1 overlaps the shared source region between the gate of the transistor T1 and the gate of the transistor T2.

In this way, the ground can be supplied from the metal wiring ALS to the source region shared between the transistors T1 and T2 through the first via hole group GVC1 overlapping the shared source region of the transistors T1 and T2 in a plan view. Therefore, since the parasitic resistance serving as the source resistance RS is only a parasitic resistance in a current path from one end of the first via hole group GVC1 to the end portion of the shared source region on the channel side, the resistance value R1 of the source resistance RS can be effectively reduced. Accordingly, it is possible to effectively prevent a decrease in the gate-source voltage of the heat generating transistor TR due to deterioration of the heat generation performance caused by the source resistance RS.

Further, when the longitudinal direction of the gate of the transistor T1 is the direction DR1, the first via hole group GVC1 is arranged along the direction DR1 in the source region shared between the transistors T1 and T2. For example, in FIG. 6, the first via hole group GVC1 is arranged along the direction DR1 from an end portion on a ground side to an end portion on a VDD side of the source region shared between the transistors T1 and T2. In this way, the ground can be supplied to the source region shared between the transistors T1 and T2 by the first via hole group GVC1 arranged along the direction DR1 to overlap the shared source region in a plan view. Therefore, it is possible to reduce the parasitic resistance in the current path from the one end of the first via hole group GVC1 arranged along the direction DR1 to the end portion on the channel side of the shared source region, and to further reduce the resistance value R1 of the source resistance RS in an efficient manner.

Further, in FIG. 6, a plurality of rows in the first via hole group GVC1 are arranged side by side in the direction DR2 along the direction DR1. For example, a via hole group in a first column of the first via hole group GVC1 is arranged along the direction DR1, and a via hole group in a second column of the first via hole group GVC1 is arranged along the direction DR1 on the direction DR2 side of the via hole group in the first column. FIG. 6 shows a case where the number of columns of the first via hole group GVC1 is 2, and the number of columns may be 3 or more.

In this way, the first via hole group GVC1 having a plurality of rows overlaps the source region shared between the transistors T1 and T2 in a plan view, so that one end of the first via hole group GVC1 can be coupled to a position close to a channel of each of the transistors in the source region shared between the transistors T1 and T2. Accordingly, it is possible to further reduce the resistance value R1 of the source resistance in an efficient manner, and to prevent deterioration of the heat generation performance of the heat generating transistor TR due to a decrease in the gate-source voltage caused by the source resistance RS.

Further, in FIG. 6, the plurality of transistors of the heat generating transistor TR include the transistor T3 and the transistor T4 having a source region shared with the transistor T3. The transistors T3 and T4 are the third transistor and the fourth transistor, respectively. As shown in FIG. 6, a second via hole group GVC2 of the plurality of via holes overlaps the source region shared between the transistor T3 and the transistor T4 in a plan view. For example, the second via hole group GVC2 overlaps the source region shared between the gate of the transistor T3 and the gate of the transistor T4.

In this way, the ground can be supplied from the metal wiring ALS to the source region shared between the transistors T3 and T4 through the second via hole group GVC2 overlapping the source region shared between the transistors T3 and T4 in a plan view. Therefore, since the parasitic resistance serving as the source resistance RS is only a parasitic resistance in a current path from one end of the second via hole group GVC2 to the end portion of the shared source region on the channel side, the resistance value R1 of the source resistance RS can be effectively reduced. Accordingly, it is possible to effectively prevent deterioration of the heat generation performance of the heat generating transistor TR due to a decrease in the gate-source voltage caused by the source resistance RS.

Further, the plurality of transistors of the heat generating transistor TR include the transistor T5 and the transistor T6 having a source region shared with the transistor T5. A third via hole group GVC3 of the plurality of via holes overlaps the source region shared between the transistors T5 and T6 in a plan view. For example, the third via hole group GVC3 overlaps the source region shared between the gate of the transistor T5 and the gate of the transistor T6.

In FIG. 7, the width of the source region of each of the plurality of transistors of the heat generating transistor TR is larger than the width of the drain region. However, when the resistance value R1 of the source resistance RS can be sufficiently reduced by the plurality of via holes VC overlapping the source region of each of the transistors in a plan view, the width of the source region does not have to be larger than the width of the drain region. For example, the width of the source region and the width of the drain region may be the same, and the plurality of via holes VC may overlap the source region in a plan view.

Figure 8:
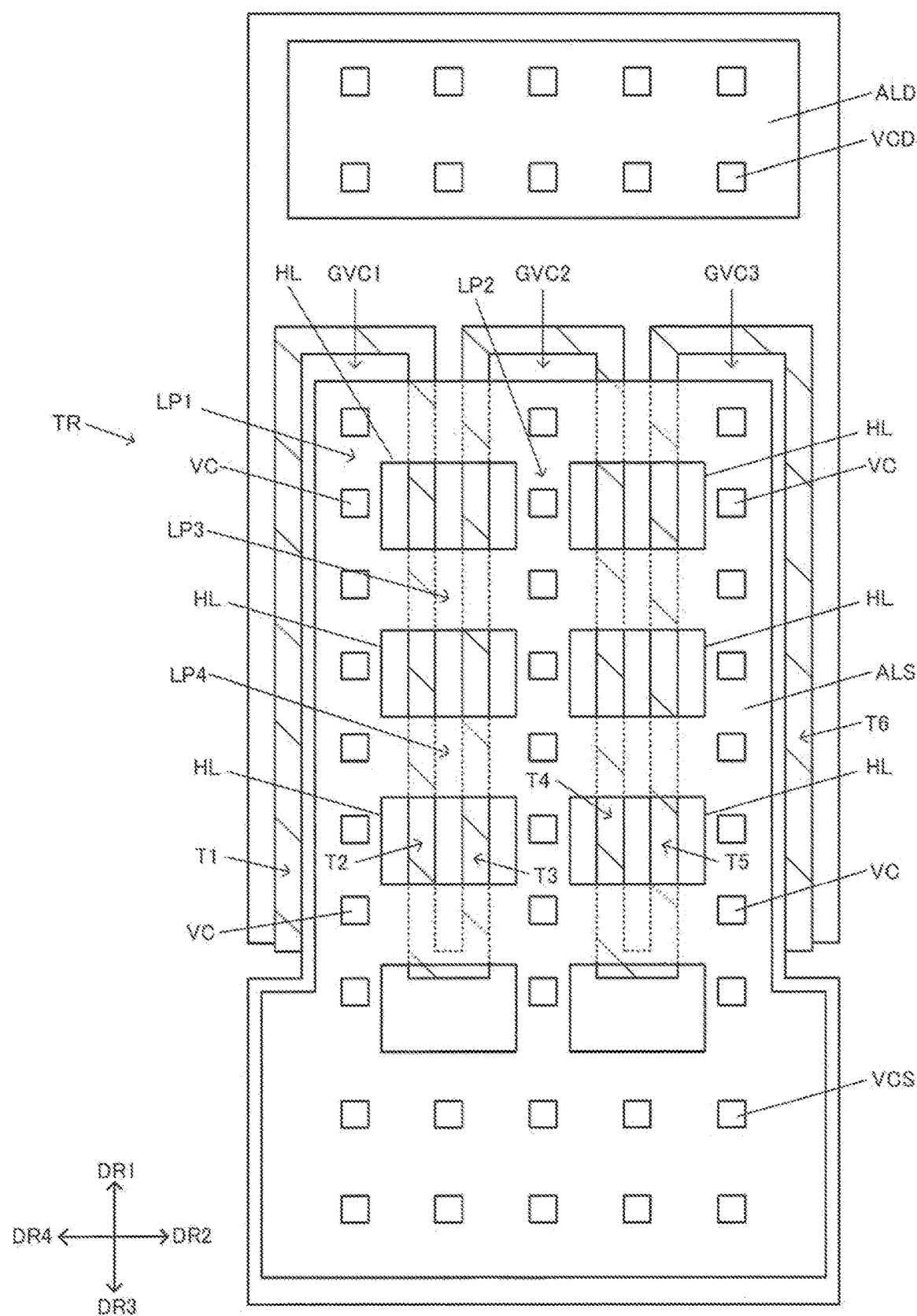
FIG. 8 shows a fourth arrangement example of the heat generating transistor.

FIG. 8 shows a fourth arrangement example of the heat generating transistor TR. In FIG. 8, the metal wiring ALS has a lattice pattern in which portions where no via holes VC are provided are holes HL. That is, the metal wiring ALS having a lattice pattern is provided such that the wiring overlaps the via holes VC in a plan view in portions where the via holes VC are provided, and the holes HL are formed in the portions where no via holes VC are provided. For example, a mesh-like metal wiring ALS is provided such that the portions where no via holes VC are provided are the holes HL.

In this way, the ground can be supplied from the metal wiring ALS having a lattice pattern overlapping the plurality of transistors T1 to T6 of the heat generating transistor TR in a plan view to the source regions of the plurality of transistors T1 to T6 via the plurality of via holes VC overlapping the source regions in a plan view. Therefore, since the currents from the source regions of the plurality of transistors T1 to T6 flow to the ground via the metal wiring ALS having a low resistance value and the plurality of via holes VC, it is possible to effectively reduce the resistance value R1 of the source resistance RS of the heat generating transistor TR.

In the metal wiring ALS having a lattice pattern, for example, by setting a width of the wiring between two of the holes HL to a thickness that does not cause decoupling due to electromigration, it is possible to prevent problems such as decoupling and short circuit from occurring due to electromigration.

As shown in FIG. 8, the metal wiring ALS includes a wiring portion LP1 provided along the first via hole group GVC1, a wiring portion LP2 provided along the second via hole group GVC2, and a wiring portion LP3 and a wiring portion LP4 that intersect the wiring portion LP1 and the wiring portion LP2 and are arranged apart at a predetermined distance. The wiring portions LP1, LP2, LP3, and LP4 refer to a first wiring portion, a second wiring portion, a third wiring portion, and a fourth wiring portion, respectively. That is, the wiring portion LP1 is a portion of the metal wiring ALS that is wired along the direction DR1 to overlap the first via hole group GVC1 in a plan view. The wiring portion LP2 is a portion of the metal wiring ALS that is wired along the direction DR1 to overlap the second via hole group GVC2 in a plan view. The wiring portion LP3 and the wiring portion LP4 are portions of the metal wiring ALS that intersect the wiring portion LP1 and the wiring portion LP2. Since the wiring portion LP3 and the wiring portion LP4 are arranged apart at a predetermined distance, the holes HL are formed between the wiring portion LP3 and the wiring portion LP4.

With such a metal wiring ALS including the wiring portions LP1, LP2, LP3, and LP4, for example, it is possible to implement the metal wiring ALS having a lattice pattern in which the portions where no via holes VC are provided are the holes HL. Since the ground is supplied from the metal wiring ALS having such a lattice pattern to the source regions of the plurality of transistors T1 to T6 via the plurality of via holes VC overlapping the source regions in a plan view, it is possible to effectively reduce the resistance value R1 of the source resistance RS of the heat generating transistor TR. By setting a thickness of each of the wiring portions LP1, LP2, LP3, and LP4 such that decoupling or the like does not occur due to electromigration, it is possible to prevent problems such as decoupling and short circuit from occurring due to electromigration.

In both cases of FIGS. 6 and 8, it is desirable to wire the metal wiring ALS from the ground pad PGND in FIG. 13 described later to the arrangement region of the heat generating transistor TR with a width that does not cause a problem due to electromigration.

Figure 9:
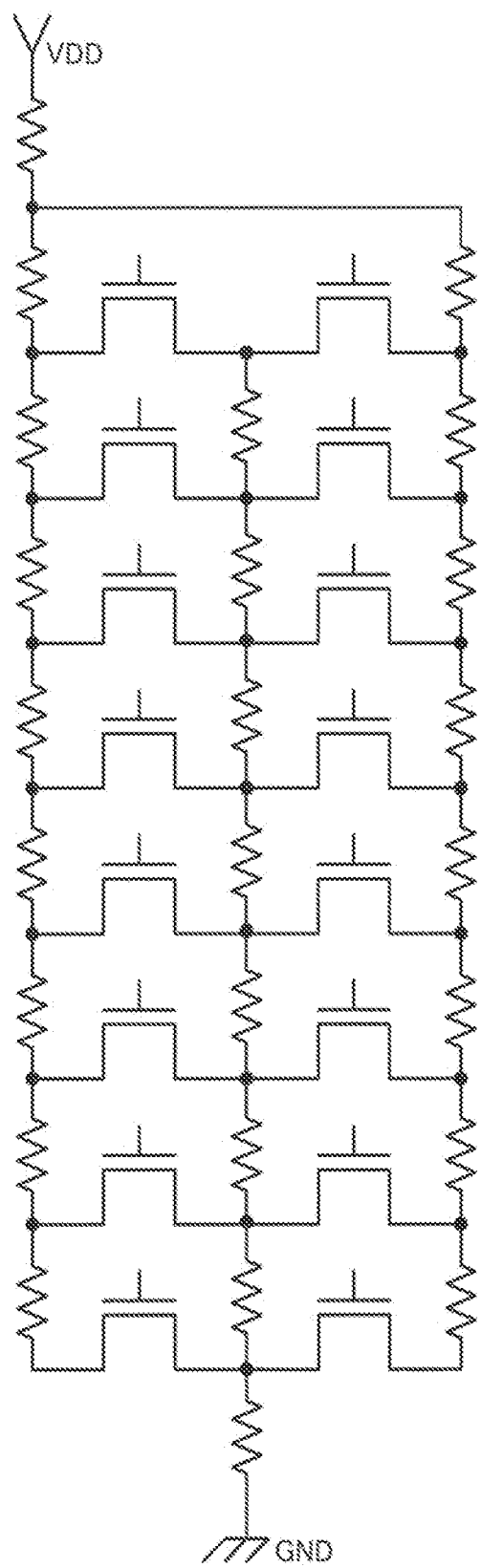
FIG. 9 shows an example of an equivalent circuit of the heat generating transistor and a parasitic resistance.
Figure 10:
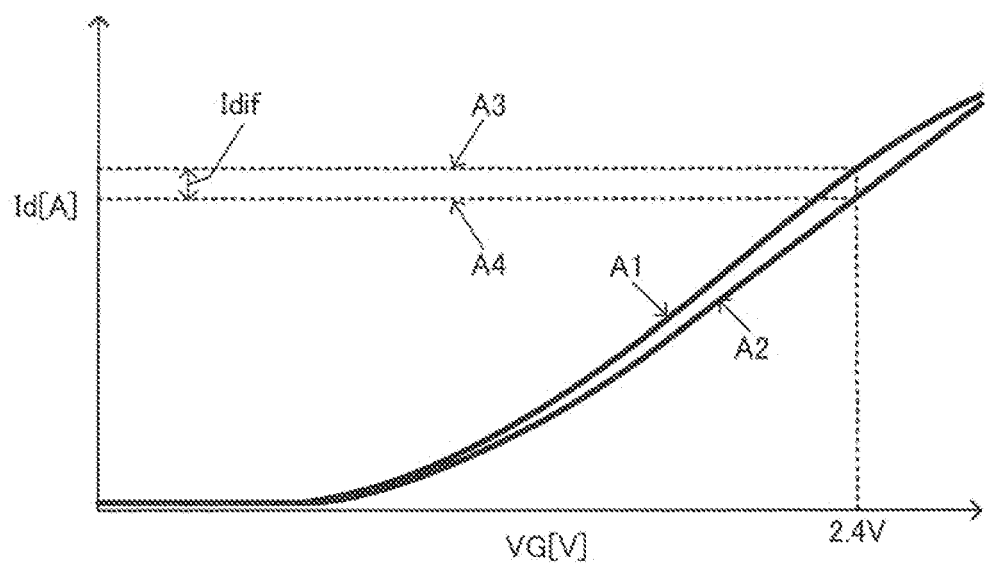
FIG. 10 is a diagram showing an example of gate voltage-current characteristics of the heat generating transistor.

FIG. 9 shows an equivalent circuit of the heat generating transistor TR and the parasitic resistances, and FIG. 10 shows gate voltage-current characteristics of the heat generating transistor TR. The equivalent circuit and circuit constants in FIG. 9 are extracted by a circuit simulator, and detailed descriptions thereof are omitted here. FIG. 10 shows the gate voltage-current characteristics of the heat generating transistor TR obtained by circuit simulation using, for example, the equivalent circuit in FIG. 9. In FIG. 10, the horizontal axis is a gate voltage VG of the heat generating transistor TR, and the vertical axis is a current Id flowing through the heat generating transistor TR. The gate voltage VG is a voltage of the temperature control signal GC, and the current Id is a current flowing between the drain and the source of the heat generating transistor TR. A1 is the gate voltage-current characteristics of the heat generating transistor TR when the method according to the present embodiment is applied, and A2 is the gate voltage-current characteristics when the method according to the present embodiment is not applied. The gate voltage during steady temperature control is, for example, about VG=2.4 V. By applying the method according to the present embodiment to reduce the source resistance RS, it is possible to increase the current Id flowing through the heat generating transistor TR when VG=2.4 V as shown in A3. For example, when the source resistance RS is large without applying the method according to the present embodiment, the current Id when VG=2.4 V is as shown in A4. Therefore, by applying the method according to the present embodiment, the current Id flowing through the heat generating transistor TR can be increased by Idif, and the heat generation performance of the heat generating transistor TR can be improved.

FIG. 11 is an example of the resistance values of the source resistance RS, the on-resistance, and the drain resistance RD when the method according to the present embodiment is not applied. Specifically, FIG. 11 shows results of the circuit simulation when the width of the source region and the width of the drain region of the transistors constituting the heat generating transistor TR are both about 5.5 μm. Meanwhile, FIG. 12 is an example of the resistance values of the source resistance RS, the on-resistance, and the drain resistance RD when the method according to the present embodiment is applied. Specifically, FIG. 12 shows results of the circuit simulation when the width of the source region is expanded to about 8 μm and the width of the drain region is reduced to about 3 μm correspondingly. FIGS. 11 and 12 show the resistance values when the gate voltage is 2.0 V, 2.4 V, and 2.8 V. The resistance value of the current limiting resistor RL is 1Ω.

By increasing the width of the source region as shown in FIG. 12, the resistance value of the source resistance RS can be reduced and the value of the on-resistance can also be reduced. By reducing the resistance value of the source resistance RS, it is possible to prevent a decrease in the gate-source voltage of the heat generating transistor TR caused by the source resistance RS, and it is possible to improve the heat generation performance. In FIG. 12, the resistance value of the drain resistance RD increases as the width of the drain region increases, and the gate-source voltage of the heat generating transistor TR does not decrease even when the resistance value of the drain resistance RD increases. Then, it is sufficient to make an adjustment to reduce the resistance value of the current limiting resistor RL by an increase amount of the resistance value of the drain resistance RD, for example. An improvement of the heat generation capacity shown in A1 and A3 in FIG. 10 and FIG. 12 can be achieved by a method for increasing the width of the source region as shown in FIGS. 3 and 5, and can also be achieved by an arrangement method of the metal wiring ALS and the via holes VC as shown in FIGS. 6 and 8.

3. Layout Arrangement of Integrated Circuit Device

FIG. 13 shows an example of a layout arrangement of the integrated circuit device 20 according to the present embodiment. The integrated circuit device 20 has an outer shape including a side SD1 and a side SD2 facing the side SD1. The integrated circuit device 20 may further have an outer shape including a side SD3 that intersects the side SD1 and the side SD2, and a side SD4 facing the side SD3. The side SD4 intersects the side SD1 and the side SD2. The sides SD1, SD2, SD3, and SD4 refer to a first side, a second side, a third side, and a fourth side, respectively. The outer shape of the integrated circuit device 20 is, for example, an outer shape of a semiconductor substrate used to implement the integrated circuit device 20. In FIG. 13, a direction from the side SD1 to the side SD2 is the first direction DR1. The side SD1 and the side SD2 are the sides along the direction DR2 orthogonal to the direction DR1, and the side SD3 and the side SD4 are the sides along the direction DR1.

The integrated circuit device 20 includes the ground pad PGND and the power supply pad PVDD. In FIG. 13, the ground pad PGND electrically coupled to the source of the heat generating transistor TR is arranged along the side SD1. Here, a plurality of ground pads PGND are arranged along the side SD1, and for example, five ground pads PGND are arranged along the side SD1. In FIG. 13, the power supply pad PVDD that supplies the power supply voltage VDD to the drain of the heat generating transistor TR is arranged along the side SD2. Here, a plurality of power supply pads PVDD are arranged along the side SD2, and for example, three power supply pads PVDD are arranged along the side SD2. Since a large current flows through the heat generating transistor TR, it is desirable to arrange a plurality of ground pads PGND and a plurality of power supply pads PVDD in this way. The number of the ground pads PGND and the power supply pads PVDD arranged is not limited to the number shown in FIG. 13, and can be any number. Further, in FIG. 13, the temperature sensor 24 is arranged on the direction DR4 side of the ground pads PGND. The pad PGC, which is an input pad of the temperature control signal GC, is arranged on the direction DR2 side of the power supply pads PVDD, and the pad PTS, which is an output pad of the temperature detection signal TS of the temperature sensor 24, is arranged on the direction DR4 side of the power supply pads PVDD. The arrangement of the temperature sensor 24, the pad PGC, and the PTS in FIG. 13 is an example, and is not limited to such an arrangement.

As shown in FIG. 13, the heat generating transistor TR is arranged between the ground pads PGND and the power supply pads PVDD. For example, the ground pads PGND are arranged on the direction DR1 side of the side SD1 of the integrated circuit device 20, the heat generating transistor TR is arranged on the direction DR1 side of the ground pads PGND, and the power supply pads PVDD are arranged on the direction DR1 side of the heat generating transistor TR. In FIG. 13, the heat generating transistor TR including the plurality of transistors as described with reference to FIGS. 3 to 8 is arranged on the direction DR1 side of the ground pads PGND such that the longitudinal direction is, for example, along the direction DR2. For example, the ground pads PGND and the heat generating transistor TR are arranged side by side along the direction DR1.

In this way, the ground pads PGND and the source of the heat generating transistor TR can be electrically coupled through a path of a short path, and the drain of the heat generating transistor TR and the power supply pads PVDD can also be electrically coupled through a path of a short path or the like. Therefore, it is possible to reduce an adverse effect of the parasitic resistance or the like in the path on the heat generation performance of the heat generating transistor TR, and it is possible to improve the heat generation performance.

Further, as described with reference to FIGS. 1 and 2, the integrated circuit device 20 includes the current limiting resistor RL having one end electrically coupled to the power supply pad PVDD and the other end electrically coupled to the drain of the heat generating transistor TR. As shown in FIG. 13, the current limiting resistor RL is arranged between the heat generating transistor TR and the power supply pads PVDD. For example, the current limiting resistor RL is arranged on the direction DR1 side of the heat generating transistor TR, and the power supply pads PVDD are arranged on the direction DR1 side of the current limiting resistor RL. For example, the current limiting resistor RL is arranged on the direction DR1 side of the heat generating transistor TR such that, for example, the longitudinal direction is along the direction DR2. For example, the heat generating transistor TR and the current limiting resistor RL are arranged side by side along the direction DR1. The current limiting resistor RL and the power supply pads PVDD are arranged side by side along the direction DR1.

In this way, one end of the current limiting resistor RL and the power supply pads PVDD can be coupled by a path of a short path, and the other end of the current limiting resistor RL and the drain of the heat generating transistor TR can be coupled by a path of a short path. Therefore, it is possible to arrange the heat generating transistor TR, the current limiting resistor RL, and the power supply pads PVDD in a compact layout along the direction DR1, for example, and it is possible to reduce the layout area of the integrated circuit device 20.

FIG. 14 shows an example of a layout arrangement of diffusion regions DF1 and DF2, the via holes VCS, and the via holes VCD as an example of the layout arrangement of the integrated circuit device 20 according to the present embodiment. The n-type diffusion region DF1 is formed in a path from a region of the ground pads PGND to the source region of the heat generating transistor TR. For example, the diffusion region DF1 has a width larger than widths of the plurality of ground pads PGND in the direction DR2, and is formed in the path from the region of the ground pads PGND to the source region of the heat generating transistor TR. In the region of the ground pads PGND, the diffusion region DF1 is formed below the ground pads PGND. Further, the n-type diffusion region DF2 is formed in a path from the drain region of the heat generating transistor TR to a region of the power supply pads PVDD. For example, the diffusion region DF2 has a width larger than widths of the plurality of power supply pads PVDD in the direction DR2, and is formed in the path from the drain region of the heat generating transistor TR to the region of the power supply pads PVDD. In the region of the power supply pads PVDD, the diffusion region DF2 is formed below the power supply pads PVDD. In a region of the heat generating transistor TR, as shown in FIGS. 3, 5, 6, and 8, a convex portion of the diffusion region DF1 serving as the source region and a concave portion of the diffusion region DF2 serving as the drain region are arranged to face each other, and a concave portion of the diffusion region DF1 serving as the source region and a convex portion of the diffusion region DF2 serving as the drain region are arranged to face each other.

As shown in FIG. 14, the current limiting resistor RL includes a plurality of diffusion resistors RL1 to RLm coupled in parallel between the power supply pads PVDD and the drain of the heat generating transistor TR. That is, the plurality of diffusion resistors RL1 to RLm are coupled in parallel between the power supply pads PVDD and the drain of the heat generating transistor TR. Each of the plurality of diffusion resistors RL1 to RLm has one end coupled to the power supply pads PVDD and the other end coupled to the drain of the heat generating transistor TR.

By providing the current limiting resistor RL with the plurality of diffusion resistors RL1 to RLm coupled in parallel between the power supply pads PVDD and the drain of the heat generating transistor TR in this way, it is possible to implement the current limiting resistor RL having a desired resistance value and a small layout area.

Further, when a direction from the side SD1 toward the side SD2 is defined as the direction DR1 and a direction orthogonal to the direction DR1 is defined as the direction DR2, the plurality of diffusion resistors RL1 to RLm are arranged side by side along the direction DR2 with a longitudinal direction of the diffusion resistors along the direction DR1. For example, the plurality of diffusion resistors RL1 to RLm having a small width with the direction DR1 as the longitudinal direction are arranged side by side along the direction DR2. For example, a plurality of holes serving as slits are formed in the diffusion region DF2, and a diffusion region between one of the holes portion and an adjacent hole serves as one of the diffusion resistors RL1 to RLm. A width of each of the plurality of diffusion resistors RL1 to RLm in the direction DR2 is, for example, about 4 to 6 µm, and a length of each of the plurality of diffusion resistors RL1 to RLm in the direction DR1 is, for example, about 40 to 50 µm.

By arranging the plurality of diffusion resistors RL1 to RLm having a small width in the direction DR2 side by side along the direction DR2 in this way, it is possible to reduce a length L3 of a layout region of the current limiting resistor RL in the direction DR1 and implement the current limiting resistor RL having a desired resistance value. Accordingly, it is possible to implement both the compact integrated circuit device 20 and the current limiting resistor RL having a desired resistance value.

Further, as shown in FIG. 14, the integrated circuit device 20 includes the plurality of via holes VCS overlapping the ground pads PGND in a plan view. For example, the plurality of via holes VCS are arranged on the entire surface of each pad of the ground pads PGND. One end of each of the plurality of via holes VCS is electrically coupled to the ground pads PGND, and the other end is electrically coupled to the source of the heat generating transistor TR. The via holes VCS correspond to the via holes VCS in FIGS. 4 and 7.

In this way, it is possible to electrically couple the ground pads PGND to the diffusion region DF1 right under the plurality of via holes VCS through the via holes VCS and electrically couple the ground pads PGND to the source of the heat generating transistor TR. Therefore, it is possible to reduce the parasitic resistance generated on the source side of the heat generating transistor TR, and it is possible to prevent deterioration of the heat generation performance of the heat generating transistor TR caused by the parasitic resistance.

Similarly, the integrated circuit device 20 includes the plurality of via holes VCD overlapping the power supply pads PVDD in a plan view. For example, the plurality of via holes VCD are arranged on the entire surface of each pad of the power supply pads PGND. One end of each of the plurality of via holes VCD is electrically coupled to the power supply pads PVDD. Further, the other end of each of the plurality of via holes VCD is coupled to one end of the current limiting resistor RL in which the other end thereof is electrically coupled to the drain of the heat generating transistor TR.

For example, as a method of the layout arrangement of a comparative example according to the present embodiment, a method for extending the diffusion region DF2 from an end portion of the heat generating transistor TR on the drain region side to the direction DR1 side, then bending the diffusion region DF2 in the direction DR2 or the direction DR4, and extending the diffusion region DF2 to the power supply pads PVDD arranged on, for example, the direction DR2 side or the direction DR4 side of the heat generating transistor TR, is considered. In the method of the comparative example, the diffusion region DF2 extending over a long distance as described above is used as the current limiting resistor RL. However, in the method of the comparative example, a region in which the diffusion region DF2 is extended and laid out is wasted, and the layout area of the integrated circuit device 20 is increased.

In this regard, in the layout arrangement according to the present embodiment shown in FIGS. 13 and 14, layout of the current limiting resistor RL is implemented by arranging the plurality of diffusion resistors RL1 to RLm in a compact layout region having a short length L3 in the direction DR1. Therefore, the heat generating transistor TR and the current limiting resistor RL can be arranged between the ground pads PGND and the power supply pads PVDD with a compact layout area. As a result, the layout area of the integrated circuit device 20 can be significantly reduced as compared with the method of the above-mentioned comparative example, and the size of the integrated circuit device 20 can be reduced.

In FIGS. 13 and 14, a length L1 of the region of the heat generating transistor TR in the direction DR1 is, for example, about 220 to 260 µm, and a length in the direction DR2 is, for example, about 700 to 900 µm. For example, transistors having a channel length L of, for example, 3µ and a channel width W of, for example, 240µ are arranged as transistors in each row of the heat generating transistor TR with the direction DR1 in the longitudinal direction. Such transistors in each row are arranged in, for example, about 100 rows along the direction DR2. The transistors in each row may be arranged by being divided into a plurality of transistors along the direction DR1, for example. For example, by forming no channel under the gate, the transistors in each row are arranged by being divided into, for example, eight stages.

In the present embodiment, the heat generation performance of the heat generating transistor TR is maintained while the integrated circuit device 20 is compact. As described in FIGS. 13 and 14, the length L3 of the region of the current limiting resistor RL in the direction DR1 is reduced to reduce the layout area of the integrated circuit device 20. For example, by implementing the current limiting resistor RL by coupling the plurality of diffusion resistors RL1 to RLm having a small width in parallel, the length L3 in the direction DR1 can be reduced. In this way, the length L1 of the region of the heat generating transistor TR in the direction DR1 is increased by an amount by which the length L3 of the region of the current limiting resistor RL in the direction DR1 is reduced. The length L1 of the region of the heat generating transistor TR in the direction DR1 is increased, and a length L2 of the region of the heat generating transistor TR in the direction DR2 is reduced. Accordingly, it is possible to maintain the W/L, which is a transistor size of the heat generating transistor TR, and to maintain the heat generation performance. By reducing the length L2 of the region of the heat generating transistor TR in the direction DR2, the integrated circuit device 20 can be compact. Therefore, it is possible to implement the compact integrated circuit device 20 and maintain the heat generation performance of the heat generating transistor TR.

4. Oscillator

FIG. 15 shows a structural example of the oscillator 4 according to the present embodiment. The oscillator 4 includes the integrated circuit device 20 according to the present embodiment and a resonator 10 whose temperature is controlled by the integrated circuit device 20. For example, the integrated circuit device 20 that is a heater IC includes the heat generating circuit 22, and heat generated by the heat generating circuit 22 makes it possible to control the temperature of the resonator 10. For example, by inputting the temperature control signal GC in FIGS. 1 and 2 to the gate of the heat generating transistor TR, heat generation of the heat generating circuit 22 is controlled, and the temperature of the resonator 10 is controlled by the heat generation control.

More specifically, the oscillator 4 in FIG. 15 includes the integrated circuit device 20, the resonator 10, an integrated circuit device 30 including an oscillation circuit 32 in FIG. 16 described later that oscillates the resonator 10, a first package 13 that houses the resonator and the integrated circuit device 30, and a second package 17 that houses the integrated circuit device 20 and the first package 13. The integrated circuit device 20 is a first integrated circuit device, and the integrated circuit device 30 is a second integrated circuit device.

In this way, it is possible to implement an oven-controlled crystal oscillator (OCXO) in which the first package 13 housing the resonator 10 and the integrated circuit device 30 that oscillates the vibrator 10 is used as a thermostatic oven. For example, the integrated circuit device 20 according to the present embodiment, which is a heater IC, is arranged on an upper surface of the first package 13, and a temperature of the first package 13, which is a thermostatic oven, is controlled by the heat generation control of the heat generating circuit 22 of the integrated circuit device 20 based on the temperature control signal GC. Accordingly, for example, the temperature control is performed with the temperature of the resonator 10 constant even when the environment temperature changes, and it is possible to implement the oven-controlled crystal oscillator.

With the structure of the oscillator 4 in FIG. 15, it is possible to use an oscillator in the related art including the resonator 10, the integrated circuit device 30, and the first package 13 that houses the resonator 10 and the integrated circuit device 30. That is, it is possible to implement the oven-controlled crystal oscillator by housing an oscillator in the related art including the resonator 10, the integrated circuit device 30, and the first package 13 in the second package 17 together with the integrated circuit device 20 that is a heater IC. Therefore, it is possible to implement the oven-controlled crystal oscillator that effectively uses an oscillator in the related art, and it is possible to reduce product costs, development costs, development periods, and the like.

Further, the oscillator 4 in FIG. 15 is provided in the second package 17, and includes an integrated circuit device 40 that outputs the temperature control signal GC to the integrated circuit device 20. The integrated circuit device 40 is a third integrated circuit device. The integrated circuit device 40 includes an oven control circuit 46 as shown in FIG. 16 described later, and the temperature control signal GC from the oven control circuit 46 is input to the integrated circuit device 20 to control heat generation of the heat generating circuit 22. In this way, the integrated circuit device 40 performs temperature control based on the temperature control signal GC to control the heat generation of the heat generating circuit 22 of the integrated circuit device 20, thereby controlling the temperature of the first package 13 which is a thermostatic oven so as to implement the oven-controlled crystal oscillator. In the present embodiment, it is possible to carry out modifications without providing the integrated circuit device 40. For example, the oven control circuit 46 may be provided in the integrated circuit device to control an oven of the oven-controlled crystal oscillator.

Next, the structure of the oscillator 4 in FIG. 15 will be specifically described. In FIG. 15, the first package 13 is made of ceramic or the like, and has a housing space SP1 inside. The resonator 10 and the integrated circuit device 30 are housed in the housing space SP1. The housing space SP1 is hermetically sealed and is preferably in a decompressed state, which is close to vacuum. The first package 13 can preferably protect the resonator 10 and the integrated circuit device 30 from impact, dust, heat, moisture and the like. The first package 13 is also used as a thermostatic oven of the oven-controlled crystal oscillator.

The first package 13 includes a base 11 and a lid 12. Specifically, the first package 13 includes the base 11 that supports the resonator 10 and the integrated circuit device 30, and includes the lid 12 that is coupled to the base 11 so as to form the housing space SP1 between the lid 12 and the base 11. The resonator 10 is supported by a step portion provided inside the base 11 via a terminal electrode. The integrated circuit device 30 is arranged on an inner bottom surface of the base 11. Electrical coupling between the integrated circuit device 30 and the resonator 10 and electrical coupling between the integrated circuit device 30 and the other integrated circuit devices 20 and 40 are performed using bonding wires BW and internal wirings of the first package 13 and the second package 17.

The second package 17 is made of ceramic or the like, and has a housing space SP2 inside. The first package 13 and the integrated circuit device 20 are housed in the housing space SP2. The housing space SP2 is hermetically sealed and is preferably in a decompressed state, which is close to vacuum. The second package 17 can preferably protect the integrated circuit device 20 and the first package 13 from impact, dust, heat, moisture and the like.

The second package 17 includes a base 15 and a lid 16. Specifically, the second package 17 includes the base 15 that supports the first package 13 and the like, and includes the lid 16 that is coupled to the base 15 so as to form the housing space SP2 between the lid 16 and the base 15. The first package 13 is arranged on an inner bottom surface of the base 15.

A concave portion is formed on a bottom surface of the second package 17. The integrated circuit device 40 is mounted on a bottom surface of the concave portion. It is possible to carry out various modifications such as arranging the integrated circuit device 40 in the housing space SP2 of the second package 17. External terminals 18 and 19 are formed on an outer bottom surface of the second package 17. The external terminals 18 and 19 are coupled to an external device via external wirings. The external wiring is, for example, a wiring formed on a circuit board on which the external device is mounted. Accordingly, it is possible to output a clock signal or the like generated by the oscillator 4 to the external device. Electrical coupling between the external terminals 18 and 19 and the integrated circuit device 40 or the like is performed using the bonding wires BW and the internal wiring of the second package 17 and the like.

The structure of the oscillator 4 is not limited to that shown in FIG. 15, and it is possible to carry out various modifications. For example, the integrated circuit device 20 may be provided in a space in which the resonator is housed to control the oven. For example, the integrated circuit device 20 may be provided between the step portion of the base 11 and the resonator 10 such that heat generated by the integrated circuit device 20 is directly transmitted to the resonator 10. Alternatively, an oscillating circuit may be provided in the integrated circuit device 20 according to the present embodiment, and the integrated circuit device 20 may be arranged in the space in which the resonator 10 is housed.

Figure 16:
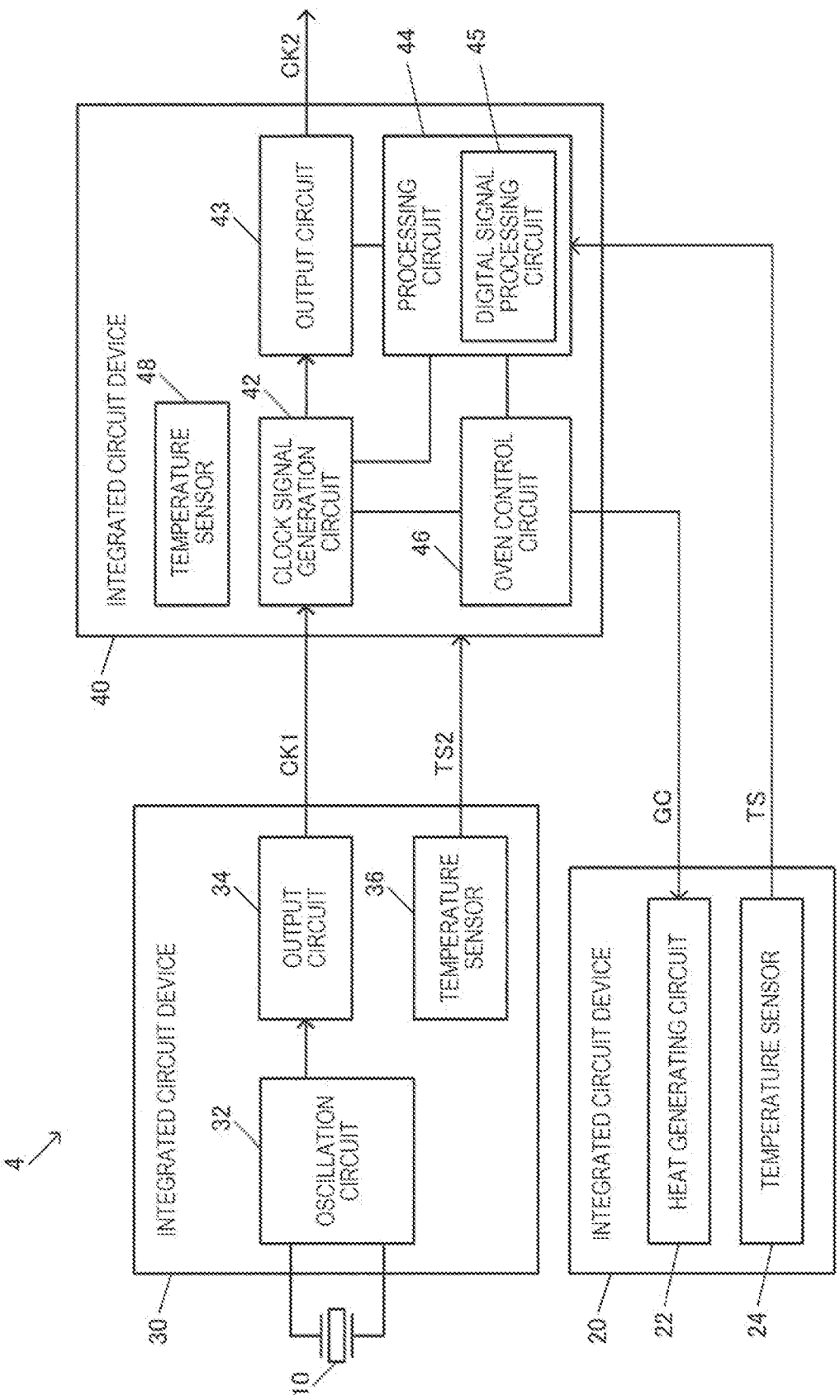
FIG. 16 shows a configuration example of the oscillator.

FIG. 16 shows a configuration example of the oscillator 4. As shown in FIG. 16, the oscillator 4 according to the present embodiment includes the resonator 10 and the integrated circuit devices 20, 30, and 40, and outputs a clock signal CK2.

The resonator 10 is an element that generates mechanical oscillation by an electric signal. The resonator can be implemented by a resonator element such as a crystal resonator element. For example, the resonator 10 can be implemented by a crystal resonator element having a cut angle of AT cut, SC cut, or the like, a tuning fork type crystal resonator element, or a double-tuning fork type crystal resonator element. The resonator 10 according to the present embodiment can be implemented by various resonator elements such as a resonator element other than a thickness-shear resonator element, a tuning fork type resonator element, or a double-tuning fork type resonator element, or a piezoelectric resonator element formed of a material other than quartz crystal. For example, as the resonator 10, a surface acoustic wave (SAW) resonator or a micro electro mechanical systems (MEMS) resonator as a silicon resonator formed using a silicon substrate may be adopted.

The integrated circuit device 30 includes the oscillation circuit 32, an output circuit 34, and a temperature sensor 36. The oscillation circuit 32 oscillates the resonator 10. For example, the oscillation circuit 32 generates an oscillation signal by oscillating the resonator 10. For example, the oscillation circuit 32 can be implemented by a drive circuit for oscillation and an active element such as a capacitor or a resistor. The drive circuit can be implemented by, for example, a CMOS inverter circuit or a bipolar transistor. The drive circuit is a core circuit of the oscillation circuit 32, and the drive circuit oscillates the resonator 10 by driving the oscillator 10 with a voltage or a current. As the oscillation circuit 32, various types of oscillation circuits such as an inverter type, a Pierce type, a Colpitts type, or a Hartley type can be used. Further, the oscillation circuit 32 may be provided with a variable capacitance circuit. An oscillation frequency can be adjusted by adjusting a capacitance of the variable capacitance circuit. The variable capacitance circuit can be implemented by a variable capacitance element such as a varactor. The coupling in the present embodiment is electrical coupling. The electrical coupling refers to coupling in which electric signals can be transmitted, and refers to coupling in which information can be transmitted by the electric signals. The electrical coupling may be coupling via a passive element or the like.

The output circuit 34 outputs a clock signal CK1 based on the oscillation signal from the oscillation circuit 32. For example, the output circuit 34 buffers the oscillation signal and outputs the oscillation signal as the clock signal CK1. Then, the clock signal CK1 is input to the integrated circuit device 40.

The temperature sensor 36 detects the temperature. Specifically, the temperature sensor 36 detects an ambient temperature and outputs a temperature detection signal TS2 that varies depending on the ambient temperature to the integrated circuit device 40. For example, the temperature sensor 36 generates the temperature detection signal TS2 by using a temperature-dependent circuit element. For example, the temperature sensor 36 outputs the temperature detection signal TS2 whose voltage varies depending on the temperature by using temperature dependence of a forward voltage of a PN junction. Alternatively, the temperature sensor 36 may output digital temperature detection data as the temperature detection signal TS2.

The integrated circuit device 20 includes the heat generating circuit 22 and the temperature sensor 24 as described with reference to FIGS. 1 and 2. The heat generating circuit 22 controls the heat generation based on the temperature control signal GC from the integrated circuit device 40. Further, the temperature sensor 24 generates the temperature detection signal TS and outputs the temperature detection signal TS to the integrated circuit device 40. The temperature sensor 24 may output digital temperature detection data as the temperature detection signal TS.

The integrated circuit device 40 includes a clock signal generation circuit 42, an output circuit 43, a processing circuit 44, the oven control circuit 46, and a temperature sensor 48. The clock signal CK1 generated based on the oscillation signal of the resonator 10 is received from the integrated circuit device 30 to the clock signal generation circuit 42. The clock signal generation circuit 42 is, for example, a PLL circuit that generates the clock signal CK2 obtained by multiplying a frequency of the clock signal CK1. The clock signal CK2 is buffered by the output circuit 43 and output to the outside. As the clock signal generation circuit 42, for example, a fractional-N type PLL circuit capable of multiplying the frequency by a fraction can be used.

The processing circuit 44 performs a temperature compensation process and various correction processes, and performs a control process of each circuit block of the integrated circuit device 40. The processing circuit 44 performs the temperature compensation process so that a frequency of the clock signal CK2 is constant even when the temperature fluctuates. For example, the temperature detection signal TS from the temperature sensor 24 of the integrated circuit device 20 and the temperature detection signal TS2 from the temperature sensor 36 of the integrated circuit device 30 are input to the integrated circuit device 40. The temperature sensor 48 is also provided in the integrated circuit device 40. The processing circuit 44 performs the temperature compensation process based on temperature detection results of the temperature sensors 24, 36, and 48. Specifically, the processing circuit 44 includes a digital signal processing circuit 45 that performs digital signal processing. The digital signal processing circuit 45 operates as a digital signal processor (DSP) and performs the digital signal processing including, for example, the temperature compensation process. Further, the digital signal processing circuit 45 performs digital filtering as the digital signal processing. For example, the digital signal processing circuit 45 performs the digital filtering such as finite impulse response (FIR) and infinite impulse response (IIR). Further, the digital signal processing circuit 45 performs the digital signal processing for aging correction. For example, Kalman filtering is performed as the digital signal processing for aging correction. Further, the digital signal processing circuit 45 performs neural network processing as the digital signal processing. For example, artificial intelligence (AI) neural network processing for analogizing the temperature of the resonator 10 is performed based on the temperature detection results of the external temperature sensors 24 and 36 of the integrated circuit device 40 and the temperature detection result of the internal temperature sensor 48 of the integrated circuit device 40.

The oven control circuit 46 outputs the temperature control signal GC to the heat generating circuit 22 of the integrated circuit device 20 to control the heat generation of the heat generating circuit 22, thereby performing oven control of the resonator 10 provided in the thermostatic oven. That is, the oven control circuit 46 controls a temperature of the thermostatic oven, which is an oven in which the resonator 10 is provided, by controlling the heat generation of the heat generating circuit 22. For example, the oven control circuit 46 performs temperature control so that an oven temperature, which is the temperature of the thermostatic oven, is a set temperature. In FIG. 15, the first package 13 functions as the thermostatic oven. The oven control circuit 46 can be implemented by, for example, a PI control circuit (proportional-integral controller) implemented by an integration circuit including an operational amplifier, a resistor, a capacitor, and the like.

As described above, an integrated circuit device according to the present embodiment includes a heat generating circuit controlled based on a temperature control signal. The heat generating circuit includes a heat generating transistor including a plurality of transistors that have a gate voltage controlled based on the temperature control signal and are coupled in parallel. A resistance value of a source resistance of the heat generating transistor is smaller than a resistance value of a drain resistance of the heat generating transistor.

In the present embodiment, in the heat generating transistor including the plurality of transistors that have a gate voltage controlled based on the temperature control signal and are coupled in parallel, the resistance value of the source resistance is smaller than the resistance value of the drain resistance. Accordingly, since the resistance value of the source resistance is smaller than the resistance value of the drain resistance, when the temperature control signal is input to a gate, it is possible to prevent a decrease in a gate-source voltage of the heat generating transistor and to prevent deterioration of heat generation capacity of the heat generating transistor caused by parasitic resistance.

In the present embodiment, the plurality of transistors may be arranged side by side along a second direction with longitudinal directions of gates of the plurality of transistors along a first direction in a plan view, the second direction being orthogonal to the first direction. The plurality of transistors may include a first transistor, and in the plan view, a width of a first source region of the first transistor in the second direction may be larger than a width of a first drain region of the first transistor in the second direction.

Accordingly, since the width of the first source region of the first transistor is larger than the width of the first drain region, it is possible to make the resistance value of the source resistance smaller than the resistance value of the drain resistance, and it is possible to prevent deterioration of heat generation performance of the heat generating transistor due to a decrease in the gate-source voltage caused by the source resistance.

In the present embodiment, the plurality of transistors may include a second transistor, and in the plan view, a width of a second source region of the second transistor in the second direction may be larger than a width of a second drain region of the second transistor in the second direction.

Accordingly, since the width of the second source region of the second transistor is larger than the width of the second drain region, it is possible to make the resistance value of the source resistance smaller than the resistance value of the drain resistance, and it is possible to prevent deterioration of the heat generation performance of the heat generating transistor due to a decrease in the gate-source voltage caused by the source resistance.

In the present embodiment, the first source region and the second source region may be a source region shared between the first transistor and the second transistor.

By sharing the source region between the first transistor and the second transistor in this way, it is possible to prevent an increase in a width of the heat generating transistor in the second direction even when the width of the source region of the first transistor and the width of the source region of the second transistor are increased. Therefore, the width of the source region of the first transistor and the width of the source region of the second transistor can be increased to reduce the resistance value of the source resistance, and an increase in a layout area of the heat generating transistor can be prevented.

In the present embodiment, the plurality of transistors may include a third transistor provided in the first direction of the first transistor. A width of a third source region of the third transistor in the second direction may be larger than a width of a third drain region of the third transistor in the second direction in the plan view. A first gate of the first transistor may be deviated from a third gate of the third transistor in the second direction.

In this way, it is possible to implement a layout arrangement in which end portions of the first transistor and the third transistor on a channel side have a stepped shape in the first direction. Also in this case, since the widths of the source regions of the first transistor and the third transistor are larger than the widths of the drain regions, the resistance value of the source resistance of the heat generating transistor can be made smaller than the resistance value of the drain resistance.

In the present embodiment, the plurality of transistors may include a third transistor provided in the first direction of the first transistor and a fourth transistor provided in the first direction of the second transistor. The first source region of the first transistor and the second source region of the second transistor may be a shared source region, and the third source region of the third transistor and the fourth source region of the fourth transistor may be a shared source region. A third gate of the third transistor may be deviated from a first gate of the first transistor in the second direction, and a fourth gate of the fourth transistor may be deviated from a second gate of the second transistor in a direction opposite to the second direction.

In this way, it is possible to implement the layout arrangement in which the end portions of the first transistor and the third transistor on the channel side have a stepped shape in the first direction, and end portions of the second transistor and the fourth transistor on the channel side have a stepped shape in the first direction. Since the width of the source region shared between the first transistor and the second transistor is larger than the width of the source region shared between the third transistor and the fourth transistor, it is possible to implement a layout arrangement in which the width of the shared source region through which a relatively large current flows is increased.

In the present embodiment, the width of the source region shared between the first transistor and the second transistor may be larger than the width of the first drain region of the first transistor and the width of the second drain region of the second transistor, and a width of the source region shared between the third transistor and the fourth transistor may be larger than a width of the third drain region of the third transistor and a width of the fourth drain region of the fourth transistor.

As described above, when the width of the source region shared between the first transistor and the second transistor is larger than the widths of the drain regions thereof, and the width of the source region shared between the third transistor and the fourth transistor is also larger than the widths of the drain regions thereof, the resistance value of the source resistance of the heat generating transistor can be made smaller than the resistance value of the drain resistance. Therefore, it is possible to prevent deterioration of the heat generation performance of the heat generating transistor due to a decrease in the gate-source voltage caused by the source resistance.

In the present embodiment, the integrated circuit device may have an outer shape including a first side and a second side facing the first side. A ground pad that is electrically coupled to a source of the heat generating transistor may be arranged along the first side, and a power supply pad that supplies a power supply voltage to a drain of the heat generating transistor may be arranged along the second side. The heat generating transistor may be arranged between the ground pad and the power supply pad.

In this way, the ground pad and the source of the heat generating transistor can be electrically coupled through a path of a short path, and the drain of the heat generating transistor and the power supply pad can also be electrically coupled through a path of a short path or the like. Therefore, it is possible to reduce an adverse effect of the parasitic resistance or the like in the path on the heat generation performance of the heat generating transistor, and it is possible to improve the heat generation performance.

In the present embodiment, a current limiting resistor having one end electrically coupled to the power supply pad and the other end electrically coupled to the drain of the heat generating transistor may be provided, and the current limiting resistor may be arranged between the heat generating transistor and the power supply pad.

In this way, one end of the current limiting resistor and the power supply pad can be coupled by a path of a short path, and the other end of the current limiting resistor and the drain of the heat generating transistor can be coupled by a path of a short path. Therefore, it is possible to arrange the heat generating transistor, the current limiting resistor, and the power supply pad in a compact layout, and it is possible to reduce the layout area of the integrated circuit device.

In the present embodiment, the current limiting resistor may include a plurality of diffusion resistors coupled in parallel between the power supply pad and the drain of the heat generating transistor.

By providing the current limiting resistor including the plurality of diffusion resistors coupled in parallel between the power supply pad and the drain of the heat generating transistor in this way, it is possible to implement the current limiting resistor having a desired resistance value and a small layout area.

In the present embodiment, when a direction from the first side toward the second side is defined as a first direction and a direction orthogonal to the first direction is defined as a second direction, the plurality of diffusion resistors may be arranged side by side along the second direction with longitudinal directions of the diffusion resistors along the first direction.

By providing the plurality of diffusion resistors having a small width in the second direction side by side along the second direction in this way, it is possible to reduce a length of a layout region of the current limiting resistor in the first direction and implement the current limiting resistor having a desired resistance value, and it is possible to implement both the compact integrated circuit device and the current limiting resistor having a desired resistance value.

In the present embodiment, a plurality of via holes overlapping the ground pad in a plan view may be provided. One end of each of the plurality of via holes may be electrically coupled to the ground pad, and the other end of each of the plurality of via holes may be electrically coupled to the source of the heat generating transistor.

In this way, it is possible to electrically couple the ground pad to a diffusion region right below the plurality of via holes through the via holes and electrically couple the ground pad to the source of the heat generating transistor. Therefore, it is possible to reduce the parasitic resistance generated on the source side of the heat generating transistor, and it is possible to prevent deterioration of the heat generation performance of the heat generating transistor caused by the parasitic resistance.

The present embodiment relates to an oscillator including the above-mentioned integrated circuit device and a resonator whose temperature is controlled by the integrated circuit device.

In this way, the temperature of the resonator can be controlled by heat generated by the heat generating circuit of the integrated circuit device.

In the present embodiment, a first integrated circuit device that is the integrated circuit device, the resonator, a second integrated circuit device including an oscillation circuit that oscillates the resonator, a first package that houses the resonator and the second integrated circuit device, and a second package that houses the first integrated circuit device and the first package may be provided.

In this way, the temperature control of the first package, which is a thermostatic oven, is performed by the heat generation control of the heat generating circuit of the first integrated circuit device based on the temperature control signal, and an oven-controlled crystal oscillator can be implemented.

In the present embodiment, a third integrated circuit device that is provided in the second package and outputs the temperature control signal to the first integrated circuit device may be provided.

In this way, the third integrated circuit device performs temperature control based on the temperature control signal to control the heat generation of the heat generating circuit of the first integrated circuit device, thereby controlling the temperature of the first package that is a thermostatic oven to implement the oven-controlled crystal oscillator.

Although the present embodiment has been described in detail above, it will be easily understood by those skilled in the art that many modifications can be made without substantially departing from novel matters and effects of the present disclosure. Therefore, all such modifications are included in the scope of the present disclosure. For example, a term described at least once together with a different term having a broader meaning or the same meaning in the specification or the drawings can be replaced with the different term in any place in the specification or the drawings. All combinations of the present embodiment and the modifications are also included in the scope of the present disclosure. The configurations, operations, and the like of the integrated circuit device and the oscillator are not limited to those described in the present embodiment, and various modifications can be made.

What is claimed is:

1. An integrated circuit device comprising:
   a heat generating circuit controlled based on a temperature control signal, wherein
   the heat generating circuit includes a heat generating transistor including a plurality of transistors that have a gate voltage controlled based on the temperature control signal and are coupled in parallel,
   a resistance value of a source resistance of the heat generating transistor is smaller than a resistance value of a drain resistance of the heat generating transistor,
   the integrated circuit device has an outer shape including a first side and a second side facing the first side,
   a ground pad that is electrically coupled to a source of the heat generating transistor is arranged along the first side,
   a power supply pad that supplies a power supply voltage to a drain of the heat generating transistor is arranged along the second side, and
   the heat generating transistor is arranged between the ground pad and the power supply pad such that an entirety of the plurality of transistors are disposed between the ground pad and the power supply pad.

2. The integrated circuit device according to claim 1, wherein
   the plurality of transistors are arranged side by side along a second direction with longitudinal directions of gates of the plurality of transistors along a first direction in a plan view, the second direction being orthogonal to the first direction,
   the plurality of transistors include a first transistor, and
   in the plan view, a width of a first source region of the first transistor in the second direction is larger than a width of a first drain region of the first transistor in the second direction.

3. The integrated circuit device according to claim 2, wherein
   the plurality of transistors include a second transistor, and
   in the plan view, a width of a second source region of the second transistor in the second direction is larger than a width of a second drain region of the second transistor in the second direction.

4. The integrated circuit device according to claim 3, wherein
   the first source region and the second source region refer to a source region shared between the first transistor and the second transistor.

5. The integrated circuit device according to claim 3, wherein
   the plurality of transistors include a third transistor provided in the first direction of the first transistor,
   in the plan view, a width of a third source region of the third transistor in the second direction is larger than a width of a third drain region of the third transistor in the second direction, and
   a first gate of the first transistor is deviated from a third gate of the third transistor in the second direction.

6. The integrated circuit device according to claim 3, wherein
   the plurality of transistors include a third transistor provided in the first direction of the first transistor and a fourth transistor provided in the first direction of the second transistor,
   the first source region of the first transistor and the second source region of the second transistor refer to a shared source region,
   a third source region of the third transistor and a fourth source region of the fourth transistor refer to a shared source region,
   a third gate of the third transistor is deviated from a first gate of the first transistor in the second direction, and
   a fourth gate of the fourth transistor is deviated from a second gate of the second transistor in a direction opposite to the second direction.

7. The integrated circuit device according to claim 6, wherein
   the width of the source region shared between the first transistor and the second transistor is larger than the width of the first drain region of the first transistor and the width of the second drain region of the second transistor, and
   a width of the source region shared between the third transistor and the fourth transistor is larger than a width of a third drain region of the third transistor and a width of a fourth drain region of the fourth transistor.

8. The integrated circuit device according to claim 1, further comprising:
   a plurality of via holes overlapping the ground pad in a plan view, wherein
   one end of each of the plurality of via holes is electrically coupled to the ground pad, and the other end of each of the plurality of via holes is electrically coupled to the source of the heat generating transistor.

9. The integrated circuit device according to claim 1, further comprising:
   a current limiting resistor having one end electrically coupled to the power supply pad and the other end electrically coupled to the drain of the heat generating transistor, wherein
   the current limiting resistor is arranged between the heat generating transistor and the power supply pad.

10. The integrated circuit device according to claim 9, wherein
    the current limiting resistor includes a plurality of diffusion resistors coupled in parallel between the power supply pad and the drain of the heat generating transistor.

11. The integrated circuit device according to claim 10, wherein
when a direction from the first side toward the second side is defined as a first direction and a direction orthogonal to the first direction is defined as a second direction, the plurality of diffusion resistors are arranged side by side along the second direction with longitudinal directions of the diffusion resistors along the first direction.

12. An oscillator comprising:
the integrated circuit device according to claim 1; and
a resonator whose temperature is controlled by the integrated circuit device.

13. The oscillator according to claim 12, further comprising:
a first integrated circuit device that is the integrated circuit device;
the resonator;
a second integrated circuit device including an oscillation circuit that oscillates the resonator;
a first package that houses the resonator and the second integrated circuit device; and
a second package that houses the first integrated circuit device and the first package.

14. The oscillator according to claim 13, further comprising:
a third integrated circuit device that is provided in the second package and outputs the temperature control signal to the first integrated circuit device.

* * * * *